US006195776B1

(12) United States Patent
Ruiz et al.

(10) Patent No.: US 6,195,776 B1
(45) Date of Patent: Feb. 27, 2001

(54) METHOD AND SYSTEM FOR TRANSFORMING SCAN-BASED SEQUENTIAL CIRCUITS WITH MULTIPLE SKEWED CAPTURE EVENTS INTO COMBINATIONAL CIRCUITS FOR MORE EFFICIENT AUTOMATIC TEST PATTERN GENERATION

(75) Inventors: Robert Ruiz, Sunnyvale; Hari Ganesan, Fremont, both of CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 09/184,518

(22) Filed: Nov. 2, 1998

(51) Int. Cl.[7] ................................................... G01R 31/28
(52) U.S. Cl. .............................. 714/738; 714/726; 703/22
(58) Field of Search ..................................... 714/738, 739, 714/741, 742, 726, 727, 728, 729; 395/500.01, 500.02, 500.19, 500.18, 500.34, 500.35, 500.36; 703/13, 21, 22

(56) References Cited

U.S. PATENT DOCUMENTS

| 5,406,497 | * | 4/1995 | Altheimer et al. | 364/489 |
|---|---|---|---|---|
| 5,491,640 | * | 2/1996 | Sharma et al. | 364/488 |
| 5,703,789 | * | 12/1997 | Beausang et al. | 364/489 |
| 6,067,650 | * | 5/2000 | Beausang et al. | 714/726 |

* cited by examiner

Primary Examiner—Christine T. Tu
(74) Attorney, Agent, or Firm—Wagner, Murabito & Hao LLP

(57) ABSTRACT

In a computer implemented synthesis system, a method of generating a test program for use in testing device with ATE (automated test equipment). The computer implemented steps of receiving an HDL specification representing a design to be realized in physical form and storing the HDL specification in a computer memory unit, receiving constraints applicable to the design, and compiling the HDL specification with a compiler to produce a netlist description of the design, wherein the netlist comprises functional logic blocks and connections there between, including sequential cells and combinational logic. The netlist is a scan-based sequential circuit netlist having multiple, skewed capture events. Combinational circuit analysis is then performed on the sequential logic netlist. The netlist is then processed to transform the netlist to a combinational logic netlist. Subsequently, ATPG (automatic test pattern generation) analysis is performed on the combinational logic netlist to generate a test program, including a plurality of test vectors, for application to the design. The test program is then stored into the computer memory unit. This test program is adapted for use with automated test equipment for testing a device resulting from the design.

27 Claims, 18 Drawing Sheets

800

900

1100

METHOD AND SYSTEM FOR TRANSFORMING SCAN-BASED SEQUENTIAL CIRCUITS WITH MULTIPLE SKEWED CAPTURE EVENTS INTO COMBINATIONAL CIRCUITS FOR MORE EFFICIENT AUTOMATIC TEST PATTERN GENERATION

FIELD OF THE INVENTION

The field of the present invention pertains to the field of automatic test pattern generation for use with electronic design automation tools. More particularly, aspects of the present invention pertain to testability analysis and test methodology analysis for use in the design of complex integrated circuits with computer aided design (CAD) tools.

BACKGROUND OF THE INVENTION

Computer systems, software applications, and the devices and processes built around them are continually growing in power and complexity. Society's reliance on such systems is likewise increasing, making it critical that the systems obey the properties that their designers intended. Typically, the more powerful and complex the system, the greater its utility and usefulness. However, as these computer and software implemented systems and processes become more powerful, detecting and correcting flaws within the systems becomes increasingly difficult.

The development of ASICs (application specific integrated circuits) and other complex integrated circuits with the aid of CAD tools is referred to as electronic design automation, or EDA. Design, checking, and testing of large-scale integrated circuits are so complex that the use of programmed computer systems are required for realization of normal circuits. This is partly because the integrated devices are inherently complex and partly because the circuit design needs to be decomposed into simpler functions which are recognized by the CAD tool. It is also partly because considerable computation is required in order to achieve an efficient layout of the resultant network. The result of the computerized design process is a detailed specification defining a complex integrated circuit in terms of a particular technology. This specification can be regarded as a template for the fabrication of the physical embodiment of the integrated circuit using transistors, routing resources, etc.

Integrated circuit designs can be represented in different levels of abstraction, such as the register transfer level (RTL) and the logical level, using a hardware description language (HDL), also called high level design language. Two exemplary forms of HDL are Verilog and VHDL. The integrated circuit can be represented by different layers of abstractions (e.g., behavioral levels, structural levels and gate levels). An RTL level is an intermediary level of abstraction between the behavioral and structural levels. HDL descriptions can represent designs of all these levels.

The behavior levels and RTL levels consist generally of descriptions of the circuit expressed with program-like constructs, such as variables, operators conditional loops, procedures, and functions. At the logic level, the descriptions of the circuit are expressed with Boolean equations. The HDL can be used along with a set of circuit constraints as an input to a computer-implemented compiler (also called a "silicon compiler"). The computer-implemented compiler program processes this description of the integrated circuit and generates therefrom a detailed list of logic components and the interconnections between these components. This list is called a "netlist." The components of a netlist can include primitive cells such as full-adders, NAND gates, NOR gates, XOR gates, latches, and D-flip flops, etc., and their interconnections can be used to form a custom design.

In processing the HDL input, the compiler first generates a netlist of generic primitive cells that are technology independent. The compiler then applies a particular cell library to this generic netlist (this process is called mapping) in order to generate a technology-dependent mapped netlist. The mapping process converts the logical representation which is independent of technology into a form which is technology dependent. The mapped netlist has recourse to standard circuits, or cells, which are available within a cell library forming a part of the data available to the computer system.

Compiler programs and mapping programs are well known in the art, and several of these systems are described in U.S. Pat. No. 5,406,497, by Altheimer et al.

As ASICs and other complex integrated circuits have become more complex and more dense, they have become progressively harder to test in order to ensure correct and complete functionality. For example, with current technology, as the number of gates and transistors increase, the time which an ASIC emerging from a fabrication process line spends in testing increases as well. This increase incurs an additional cost on ASIC manufacturing. The testing cost can be very significant for the latest and largest memories. In addition, as more complex systems-on-a-chip devices proliferate, which, for example, integrate complex logic units (integer units, floating point units, memory, etc.) into a single chip, and as newly-designed processors begin to take advantage of the ability to integrate large quantities of memory on-chip, it has become necessary to increase the comprehensiveness, efficiency, and accuracy of the design checking and testing schemes utilized to ensure proper operation of these devices (e.g., ASICs, complex integrated circuits, field programmable gate arrays, etc.).

Thus, an increasingly important part of the logic synthesis and testing process involves designing ASICs and other complex integrated circuits for inherent testability. Programs that aid in the testability process of logic synthesis are called design for test (DFT) processes. As part of DFT, it is well known to take the mapped netlist generated from a compiler and add and/or replace certain memory cells and associated circuitry with special memory cells that are designed to allow the application of test vectors to certain logic portions of the integrated circuit. The act of applying test vectors is called stimulation of the design, and the special memory cells and associated circuitry are referred to as DFT implementations. Issues concerning controllability deal with facilitating the application of the test vectors to the circuitry to be tested. The same memory cells can be used to capture the output of the circuitry for observation and compare this output to the expected output in an effort to determine if circuit (e.g., manufacturing) defects are present.

The portions of an integrated circuit that are designed to perform its intended or expected operational function are called its "mission mode" circuitry, while the portions added to the integrated circuit to facilitate testability are called "test mode" circuitry or DFT implementations. The resultant circuit, therefore, has two functional modes, mission and test.

Prior art FIG. 1A shows an exemplary flow chart diagram of a typical prior art logic synthesis process, including a DFT process. The processes 200 described with respect to this flow chart is implemented within a computer system in a CAD environment. High level design language (HDL) descriptions of the integrated circuit enter at block 201. Accompanying the HDL 201 is a set of performance constraints applicable to the design which typically include timing, area, power consumption, and other performance related limitations that the compiler (e.g., in step 202) will attempt to satisfy when synthesizing the integrated circuit design. These constraints can also include non-performance related constraints such as structural and routing constraints. In step 202, the HDL descriptions of the integrated circuit are compiled. The compiler (also called an HDL compiler, RTL synthesizer, or architectural optimizer) inputs the HDL 201 description and generates therefrom a technology independent or "generic" netlist. The generic netlist is then compiled using logic optimization procedures and a mapping procedures which interface with a technology dependent cell library 204 (e.g., from LSI, VLSI, TI or Xilinx technologies, etc.). The cell library 204 contains specific information regarding the cells of the specific technology selected such as the cell logic, number of gates, area consumption, power consumption, pin descriptions, etc., for each cell in the library 204. The compiling procedure of block 202 ultimately generates a gate level mapped netlist 203 that is technology dependent having cells specifically selected in accordance with the particular manufacturing technology being used to fabricate the device.

At block 205 of FIG. 1A, DFT process performs a particular test insertion process (here a scan) to implement testability cells or "test mode" cells into the overall integrated circuit design. In this process 205, memory cells of the mapped netlist 203 are replaced with memory cells that are specially designed to apply and observe test vectors or patterns to and from portions of the integrated circuit. In one particular DFT process, these memory cells specially designed for test are called scannable memory cells. The test vector patterns can be derived from combinational or sequential automatic test pattern generation (ATPG) processes depending on whether or not a full or partial scan is performed by the scan insertion process 205. Process 205 also performs linking groups of scannable memory cells into scan chains so that the test vectors can be cycled into and out of the integrated circuit design. The output of the scan insertion process 205 is a scannable, or scanned, netlist 206.

The scanned netlist 206 is then subjected to automatic test pattern generation tools in block 207. The out of a test pattern generation tools apply a specific procedure referred to as "design rule checking", or DRC, to determine whether the tools properly understand and can properly interpret the parameters, interconnections, etc. of the scanned netlist 206. DRC functions by verifying whether the specific format or protocols of the scanned netlist 206 match the constraints and/or formats used by the ATPG (automatic test pattern generation) tool. If the scanned netlist 206 passes combinational ATPG DRC, the scanned netlist 206 is passed to step 208 for combinational ATPG processing. Automatic test pattern generation processing in step 208 is performed using a set of specific test constraints 213 which were created by a user in step 212, or otherwise obtained from design processes. As depicted in diagram 200, the ATPG processing of block 208 is performed using combinational techniques. The result of this processing is a test program 209 adapted for application to automatic test equipment. In block 210, test program 209 is verified to determine whether it meets requirements for the device. If the test program meets requirements, the test program is used with automatic test equipment in block 211 to apply test vectors to the scannable cells inserted in step 205.

However, the problem with the prior art process of diagram 200 is the fact that scanned netlist 206 often will not pass ATPG DRC in step 207. This leads to number of serious consequences. These consequences often add complexity, expense, and time consumption to the design process. As shown in FIG. 1A, if the scanned netlist 206 does not pass ATPG DRC in step 207, a number alternatives are pursued.

A first alternative 220 is depicted in FIG. 1B. In this alternative, combinational ATPG processing is abandoned in favor of sequential ATPG processing. Sequential processing has the advantage of being less restrictive with regard to the parameters, formats, etc. of scanned netlist 206. However, sequential processing has a very serious disadvantage in that it is far more processor intensive and time-consuming than combinational processing.

A second alternative 230 is depicted in FIG. 1C. In this alternative, the original test constraints 212 are modified in block 231, resulting in new test constraints 232. The new test constraints 232 will hopefully allow scanned netlist 206 to pass a re-executed combinational ATPG DRC in block 233. In block 234, if design rule checking is passed, the process returns (back to combinational ATPG processing in step 208). If not, the test constraints may be modified again.

A third alternative 240 is depicted in FIG. 1D. In this alternative, as opposed to modifying the original test constraints 212, the original scan insertion 205 is modified in block 241, resulting in a new scan to netlist 242. This new scanned netlist 242 is then processed for ATPG DRC. If DRC is passed, in block 243, the process returns (back to combinational ATPG processing in block 208). If not, the scan insertion may be modified again.

FIG. 1E shows a process 250 which are used when the test program 209 does not meet the test requirements in step 210. In steps 251, 252, and 253, the test program is manually modified, by a design engineer, for example, to obtain a new test program which is subsequently check to determine whether it meets test requirements. The designer is free to manually modify the test program in any of a number of ways in hopes of making the program meet test requirements. If the test program meets requirements, the process returns (back to block 211 of FIG. 1A).

Thus, the prior art process 200 of FIG. 1A has several disadvantages. It is disadvantageous to execute sequential ATPG processing as shown in FIG. 1B, if it can be avoided at all. Thus, it is very disadvantageous to have scanned netlist 206 not pass ATPG DRC in block 207. It is disadvantageous to have to modify test constraints multiple times in order to coax the scanned netlist 206 into passing ATPG DRC, as depicted in FIG. 1C. Similarly, it is disadvantageous to have to modify the scan insertion multiple times in hopes of coaxing the scanned netlist 206 into passing ATPG DRC, as depicted in FIG. 1D.

Each of the above modifications require new, time-consuming, compiles. Although one or more of these compiles can be an incremental compile step in that much of the gate level connections are not removed, mapping optimization portions of this compile process still operate in an iterative fashion over the entire design. The addition of this additional compile processes, using conventional technology, delays the overall integrated circuit synthesis process by as much as one to two weeks. Even after this long delay, there are no guarantees that the additional compiles will generate a scannable netlist satisfying ATPG DRC in step 207.

With respect to the alternative shown in FIG. 1E, the task of manually modifying the test program in step 251 is one of the most time-consuming and error prone of the above processes. This involves and engineer manually sifting through data sheets to modify any number of test vectors included in the test program. It is highly desirable, especially in a computer-aided design environment, to avoid manually returning to the HDL design or the test program for manual adjustments and tinkering. The cumulative effect of the above limitations results in the fact that the number/types of scanned netlists 206 which can be used in the design synthesis process is greatly limited.

Thus, what is required is a system which provides an order of magnitude improvement in run-time performance for ATPG and similar analysis-related programs. What is required is a system which allows ATPG analysis and processing of scannable netlists which may not adhere to conventional DFT design rules and which thereby allows the analysis and processing of a broader variety of circuit types. What is required is a system which provides a time-efficient design synthesis system operable within a computer-implemented CAD system that includes effective DFT processes. What is further required is a system which effectively broadens the constraints with which the scannable netlist is subjected, thereby reducing the complexity and the amount of time required in recompiling the HDL design. Additionally, what is further required is a system which provides for increased testing coverage of a resulting design, thereby providing more efficient testing completed devices.

SUMMARY OF THE INVENTION

The present invention provides a system which enables an order of magnitude improvement in run-time performance for ATPG and similar analysis-related programs. The system of the present invention allows ATPG analysis and processing of scannable netlists which may not adhere to conventional DFT design rules and which thereby allows the analysis and processing of a broader variety of circuit types. The system of the present invention provides a time efficient design synthesis system operable within a computer-implemented CAD system that includes effective DFT processes. The present invention further provides a system which effectively broadens the constraints with which the scannable netlist is subjected, thereby reducing the complexity and the amount of time required in recompiling the HDL design. Additionally, the present invention provides for increased testing coverage of a resulting design, thereby providing more efficient testing completed devices.

In one embodiment, the present invention is implemented as a process in a computer-implemented synthesis system. In this implementation, the process provides a method for generating a test program for use in testing device with ATE (automated test equipment). The process includes the computer-implemented steps of receiving an HDL specification representing a design to be realized in physical form and storing the HDL specification in a computer memory unit, receiving constraints applicable to the design, and compiling the HDL specification with a compiler to produce a netlist description of the design, wherein the netlist comprises functional logic blocks and connections there between, including sequential cells and combinational logic.

The netlist is a scan-based sequential circuit netlist having multiple, skewed capture events. The netlist is processed to transform the netlist to a combinational logic netlist. The present invention is successfully able to characterize scannable memory cells included in the combinational logic netlist based upon their observability and their controllability relative to the multiple capture events. Non-scannable memory cells included in the netlist which exhibit constant behavior during the capture sequences are replaced with combinational elements reflecting their logic state (e.g., a logical one or a logical zero). Subsequent to these characterizations, combinational circuit analysis is performed on the combinational logic netlist. An ATPG (automatic test pattern generation) pattern generator then performs simulation analysis on the combinational logic netlist to generate a test program, including a plurality of test vectors, for application to the design. This test program is adapted for use with automated test equipment for testing a device resulting from the design. The test program provides much greater coverage than possible with test programs generated by prior art processes. In addition, ATPG runs much faster than possible in the prior art.

BRIEF DESCRIPTION OF THE DRAWINGS

The present invention is illustrated by way of example and not by way of limitation, in the figures of the accompanying drawings and in which like reference numerals refer to similar elements and in which.

Prior art

Prior art

Prior art

Prior art

Prior art

DETAILED DESCRIPTION OF THE INVENTION

Figure 1A:
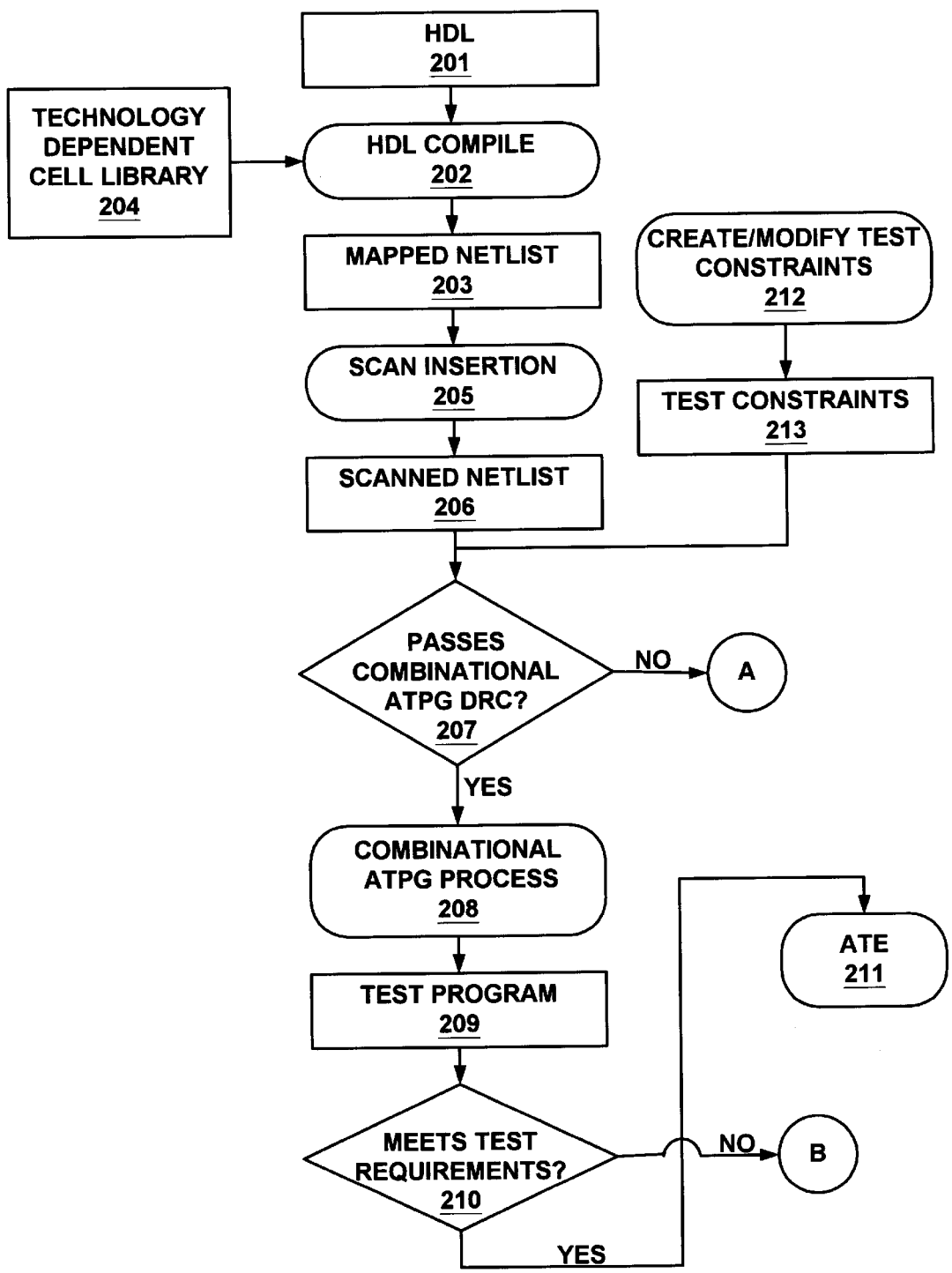
FIG. 1A shows an exemplary flowchart diagram of a typical prior art logic synthesis process, including a design-for-test process.
Figure 1B:
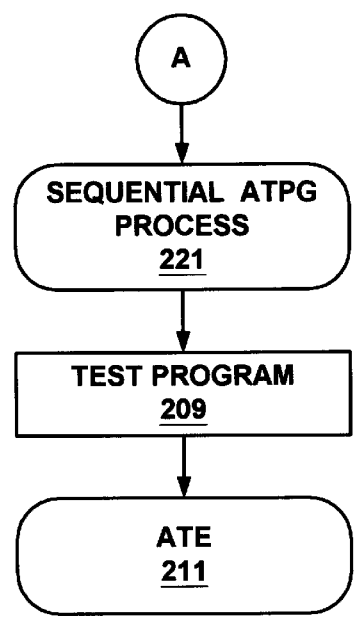
FIG. 1B shows an exemplary flowchart diagram of a typical sequential ATPG process as used with the process of FIG. 1A.
Figure 1C:
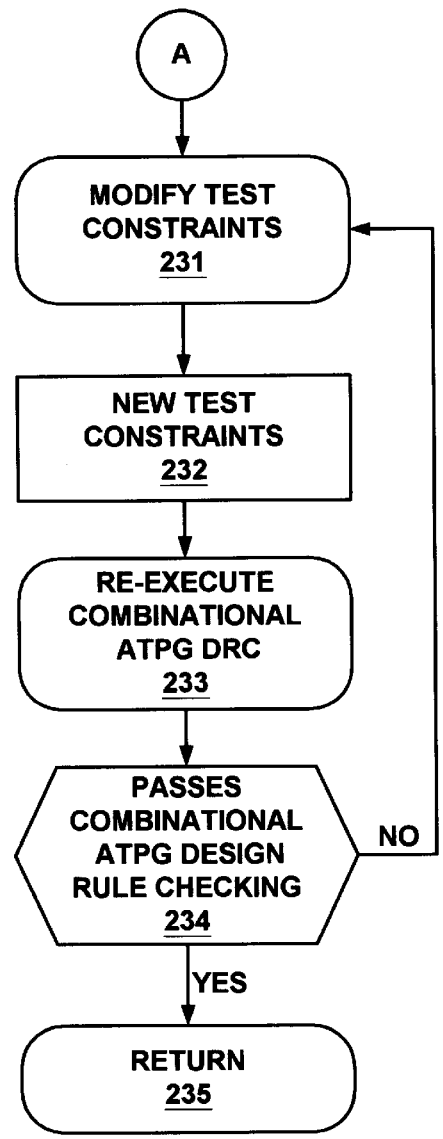
FIG. 1C shows an exemplary flowchart diagram of a test constraint modification process as used with the process of FIG. 1A.
Figure 1D:
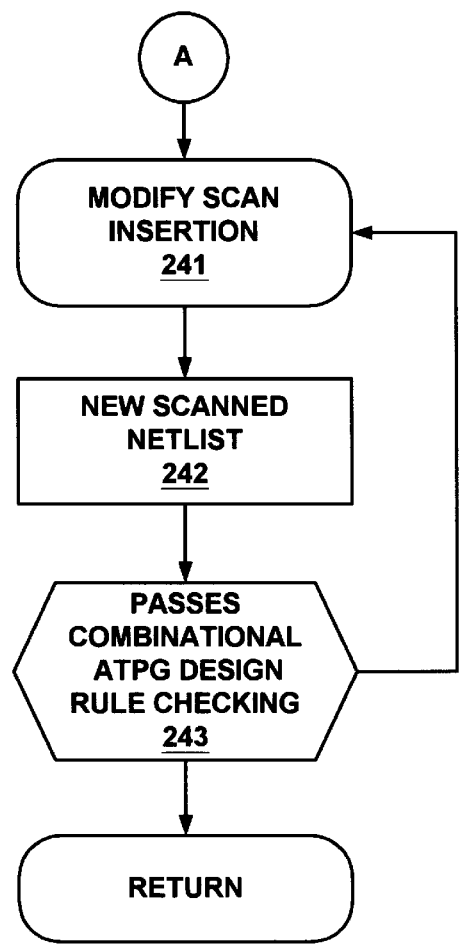
FIG. 1D shows an exemplary flowchart diagram of a scan insertion modification process as used with the process of FIG. 1A.
Figure 1E:
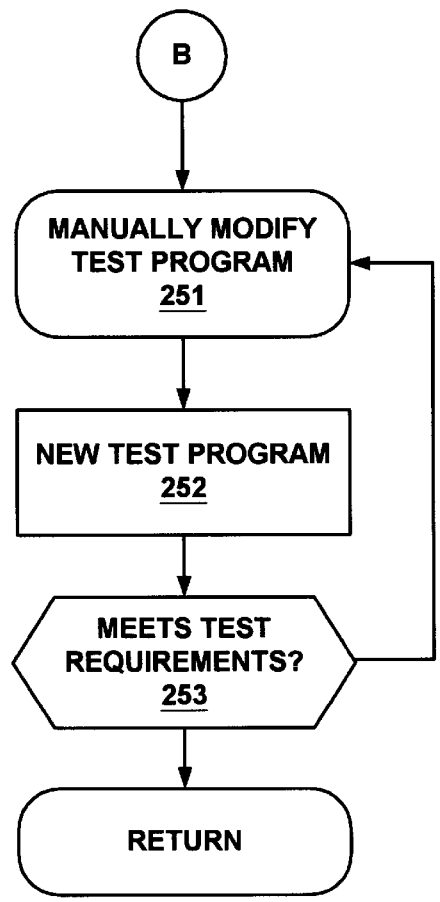
FIG. 1E shows an exemplary flowchart diagram of a manual modification process as used with the process of FIG. 1A. a method to FIG. 2 shows a computer system in accordance with one embodiment of the present invention.

Reference will now be made in detail to the embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to obscure aspects of the present invention unnecessarily.

The present invention provides a system which enables an order of magnitude improvement in run-time performance for ATPG and similar analysis-related programs. The system of the present invention allows ATPG analysis and processing of scannable netlists which may not adhere to conventional DFT design rules and which thereby allows the analysis and processing of a broader variety of circuit types. The system of the present invention provides a time-efficient design synthesis system operable within a computer-implemented CAD system that includes effective DFT processes. The present invention further provides a system which effectively broadens the constraints with which the scannable netlist is subjected, thereby reducing the complexity and the amount of time required in recompiling the HDL design. Additionally, the present invention provides for increased testing coverage of a resulting design, thereby providing more efficient testing completed devices.

NOTATION AND NOMENCLATURE

Some portions of the detailed descriptions which follow are presented in terms of procedures, steps, logic blocks, processing, and other symbolic representations of operations on data bits within a computer memory. These descriptions and representations are the means used by those skilled in the data processing arts to convey most effectively the substance of their work to others skilled in the art. A procedure, computer executed step, logic block, process, etc., are here, and generally, conceived to be self-consistent sequences of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing," "computing," "translating," "instantiating," "determining," "displaying," "recognizing," or the like, refer to the action and processes of a computer system, or similar electronic computing device, that manipulates and transforms data represented as physical (electronic) quantities within the computer system's registers and memories into other data similarly represented as physical quantities within the computer system registers or memories or other such information storage, transmission, or display devices.

COMPUTER SYSTEM ENVIRONMENT

Figure 2:
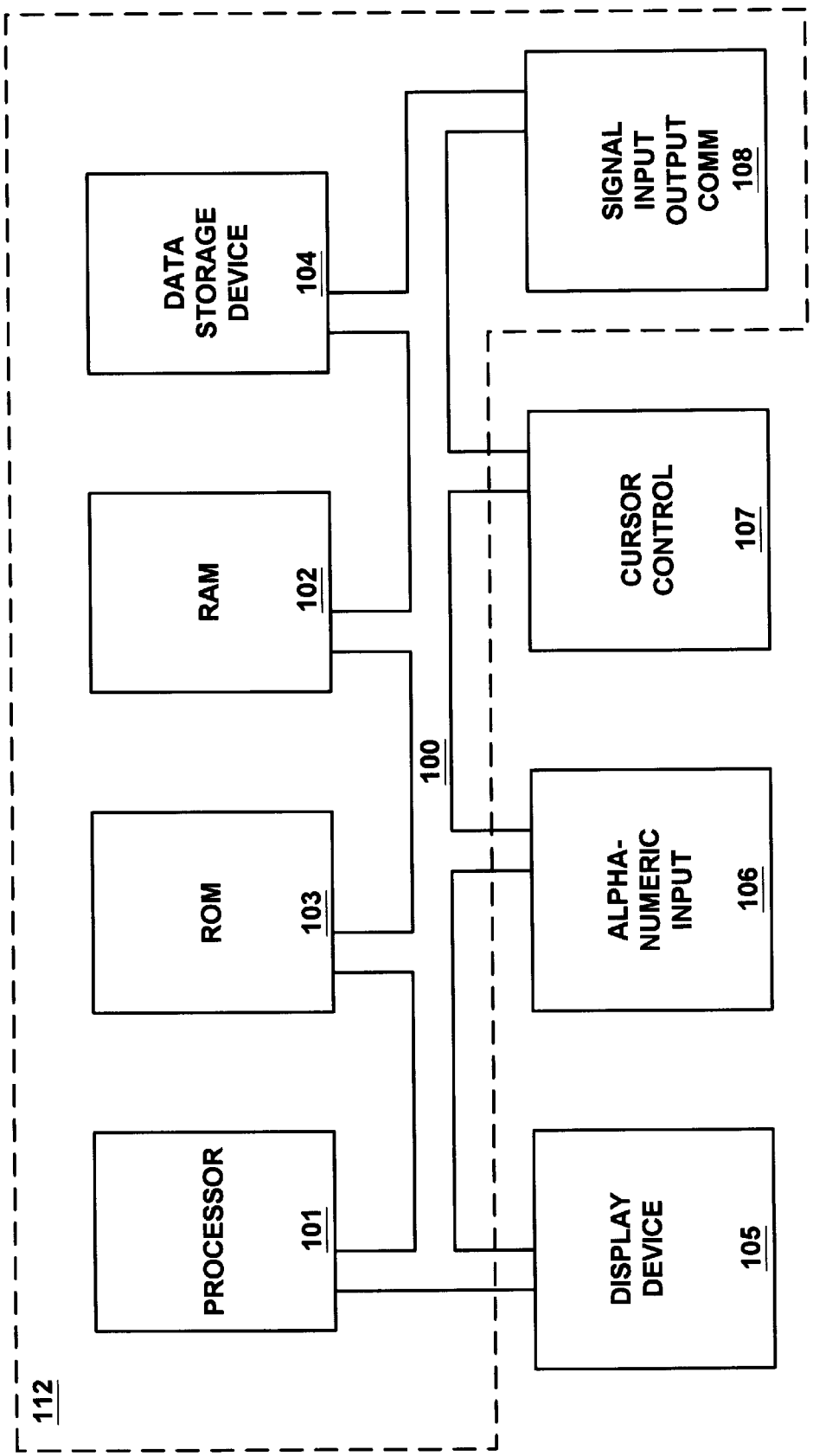

Referring to FIG. 2, a computer system 112 is illustrated. Within the following discussions of the present invention, certain processes and steps are discussed that are realized, in one embodiment, as a series of instructions (e.g., software program) that reside within computer readable memory units of system 112 and executed by processors of system 112. When executed, the instructions cause computer system 112 to perform specific actions and exhibit specific behavior which is described in detail to follow.

Specific aspects of the present invention are operable within a programmed computer aided design (CAD) system. A CAD system operable to implement the elements of the present invention is shown in FIG. 2. In general, the CAD system of the present invention includes an address/data bus 100 for communicating information, one or more central processor(s) 101 coupled with bus 100 for processing information and instructions, a computer readable volatile memory unit 102 (e.g., random access memory, static RAM, dynamic RAM, etc.) coupled with bus 100 for storing information and instructions for the central processor(s) 101, a computer readable non-volatile memory unit 103 (e.g., read only memory, programmable ROM, flash memory, EPROM, EEPROM, etc.) coupled with bus 100 for storing static information and instructions for processor(s) 101. System 112 can optionally include a mass storage computer readable data storage device 104, such as a magnetic or optical disk and disk drive coupled with bus 100 for storing information and instructions. Optionally, system 112 can also include a display device 105 coupled to bus 100 for displaying information to the computer user, an alphanumeric input device 106 including alphanumeric and function keys coupled to bus 100 for communicating information and command selections to central processor(s) 101, a cursor control device 107 coupled to bus for communicating user input information and command selections to the central processor(s) 101, and a signal input/output device 108 coupled to the bus 100 for communicating messages, command selections, data, etc., to and from processor(s) 101.

Program instructions executed by the CAD system can be stored in RAM 102, ROM 103, or the storage device 104 and, when executed in a group, can be referred to as logic blocks or procedures. It is appreciated that data produced at the various logic synthesis stages of the present invention, including representations of the different levels of abstraction of the integrated circuit design, can also be stored in RAM 102, ROM 103, or the storage device 104 as shown in FIG. 2.

The display device 105 of FIG. 2 utilized with the computer system 112 of the present invention may be a liquid crystal device, cathode ray tube, or other display device suitable for creating graphic images and alphanumeric characters recognizable to the user. The cursor control device 107 allows the computer user to signal dynamically the two dimensional movement of a visible pointer on a display screen of the display device 105. Many implementations of the cursor control device are known in the art including a trackball, mouse, joystick, or special keys on the alphanumeric input device 105 capable of signaling movement of a given direction or manner of displacement.

Figure 3A:
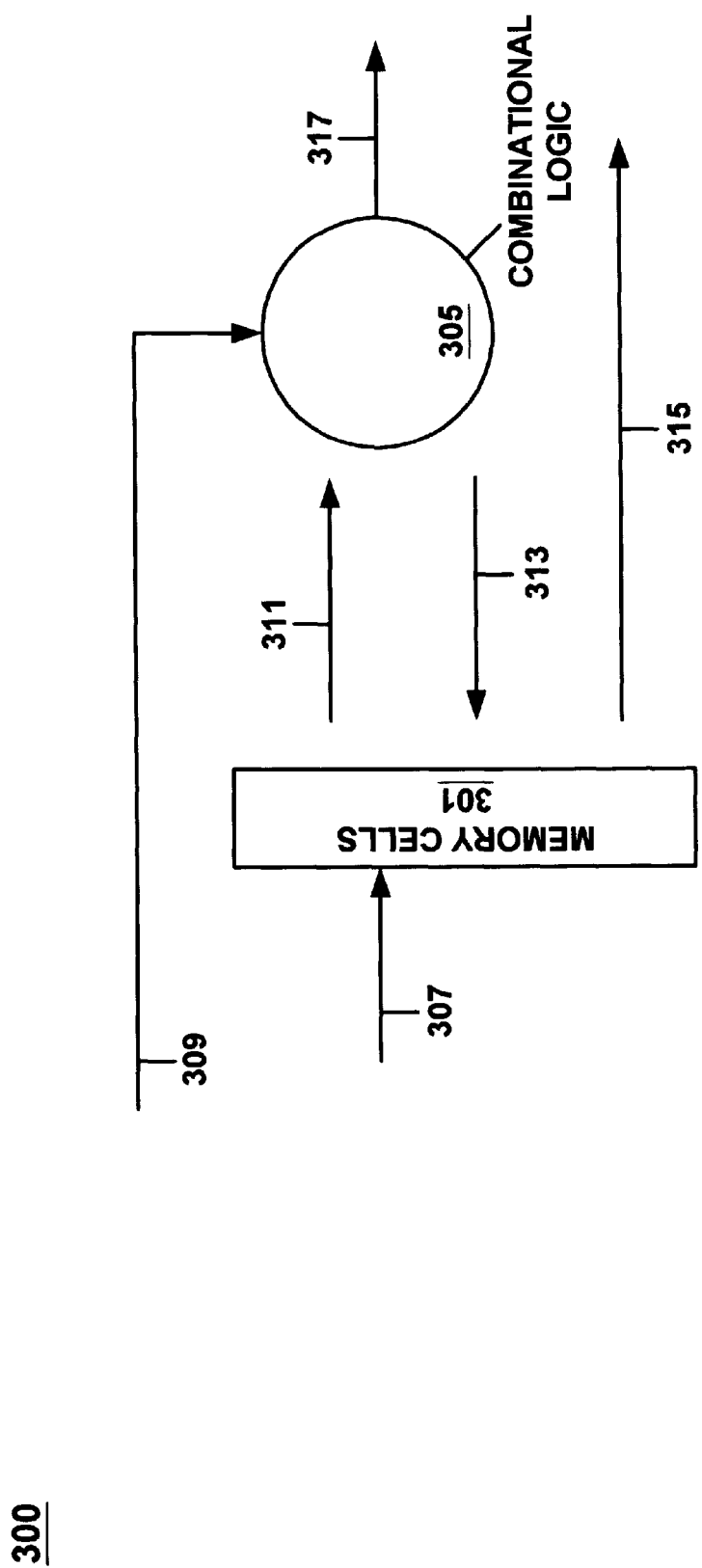
FIG. 3A shows a circuit level utilize by the present invention to represent a logic unit of integrated circuit.

FIG. 3A illustrates a circuit model 300 utilized by the present invention to represent a logic unit of an integrated circuit. The model 300 includes a memory cell block 301 that outputs signals over line 311 to a combinational logic block 305. Combinational logic block 305 also outputs signals over line 313 to drive inputs of the memory cells 301. Memory 301 receives a primary input signal 307 which typically originates off chip. Combinational logic block 305 also receives a primary input signal 309 which typically originates off chip. Memory block 301 generates a primary output signal 315 that goes off chip and combinational logic block 305 also generates a primary output signal 317 that goes off chip. According to model 300, memory block 301 is composed either of edge sensitive clocked memory cells (e.g., flip-flops), level sensitive memory cells (e.g., latches or registers), or can be composed of other cell types. A variety of memory modes or styles, including either of the memory modes described above, are acceptable within the present invention. For purposes of explanation, the memory cell style adopted within discussions herein is the edge triggered flip-flop, but the present invention is equally adapted for other styles, such as level sensitive modes, e.g., Level Sensitive Scan Design (LSSD) modes, clocked scan modes, clocked LSSD modes, and auxiliary clocked LSSD modes.

As shown by FIG. 3A, portions of combinational logic block 305 that are directly stimulated by primary input 309 and that are directly coupled by its output to primary line 317 can be readily tested for faults (faulty circuitry) by direct application of test vectors (predetermined data patterns) over line 309 and by direct observation of the output over line 317. However, this represents only a small percentage of the logic of block 305. In typical applications, most of the logic gates within block 305 receive their inputs from memory cells within 301 and forward their outputs to other memory cells within 301. In order to test accurately the combinational logic within block 305, DFT processes provide a mechanism for isolating different logic groups within block 305 by (1) passing test vectors into the memory cells 301, (2) allowing the stimulated logic groups to store the product information in predetermined memory cells, and then (3) recalling the output from stimulated portions of block 305 from memory 301.

In effect, test vectors are scanned into the memory cells during test mode, the combinational logic is operated, and its output is then captured in the memory cells to be scanned out.

Figure 3B:
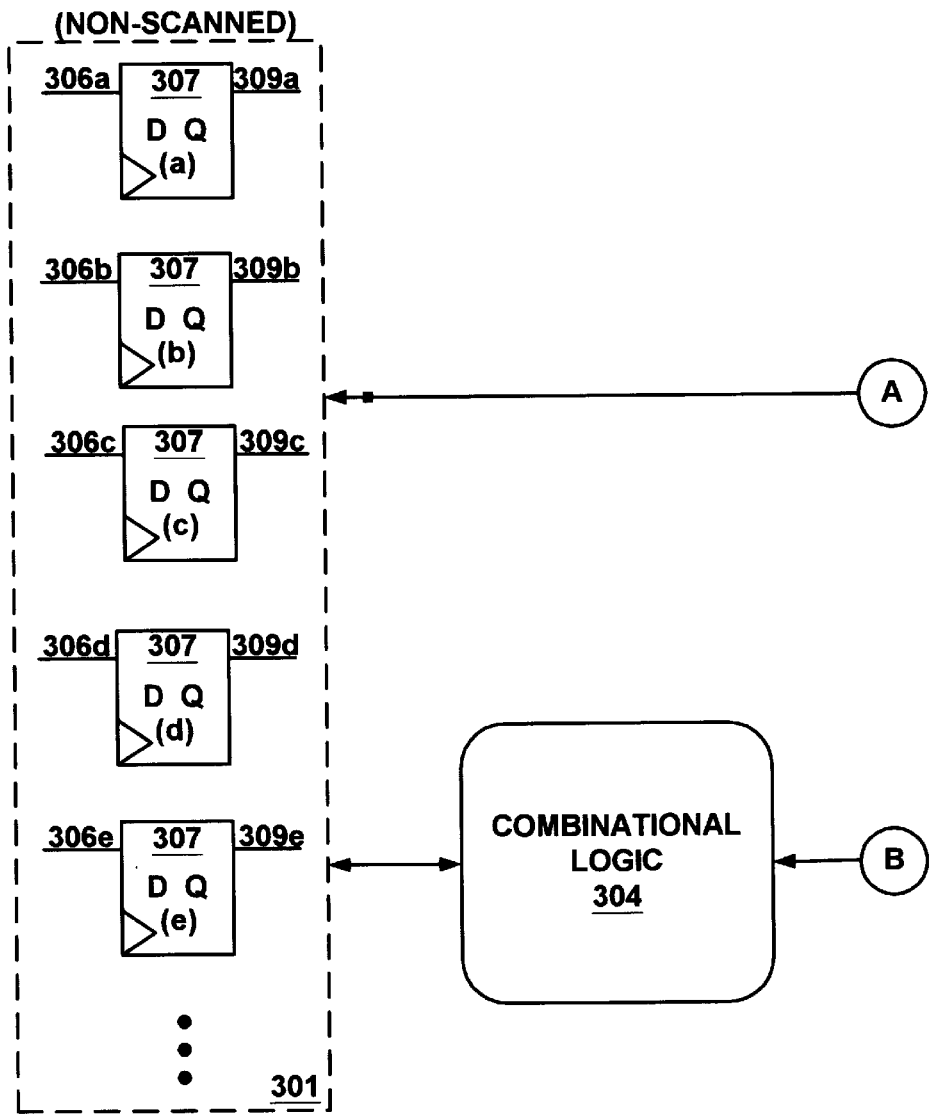
FIG. 3B illustrates a portion of the structure of the map memory cells from FIG. 3A test typically specified or inferred in an HDL circuit description.
Figure 3B:
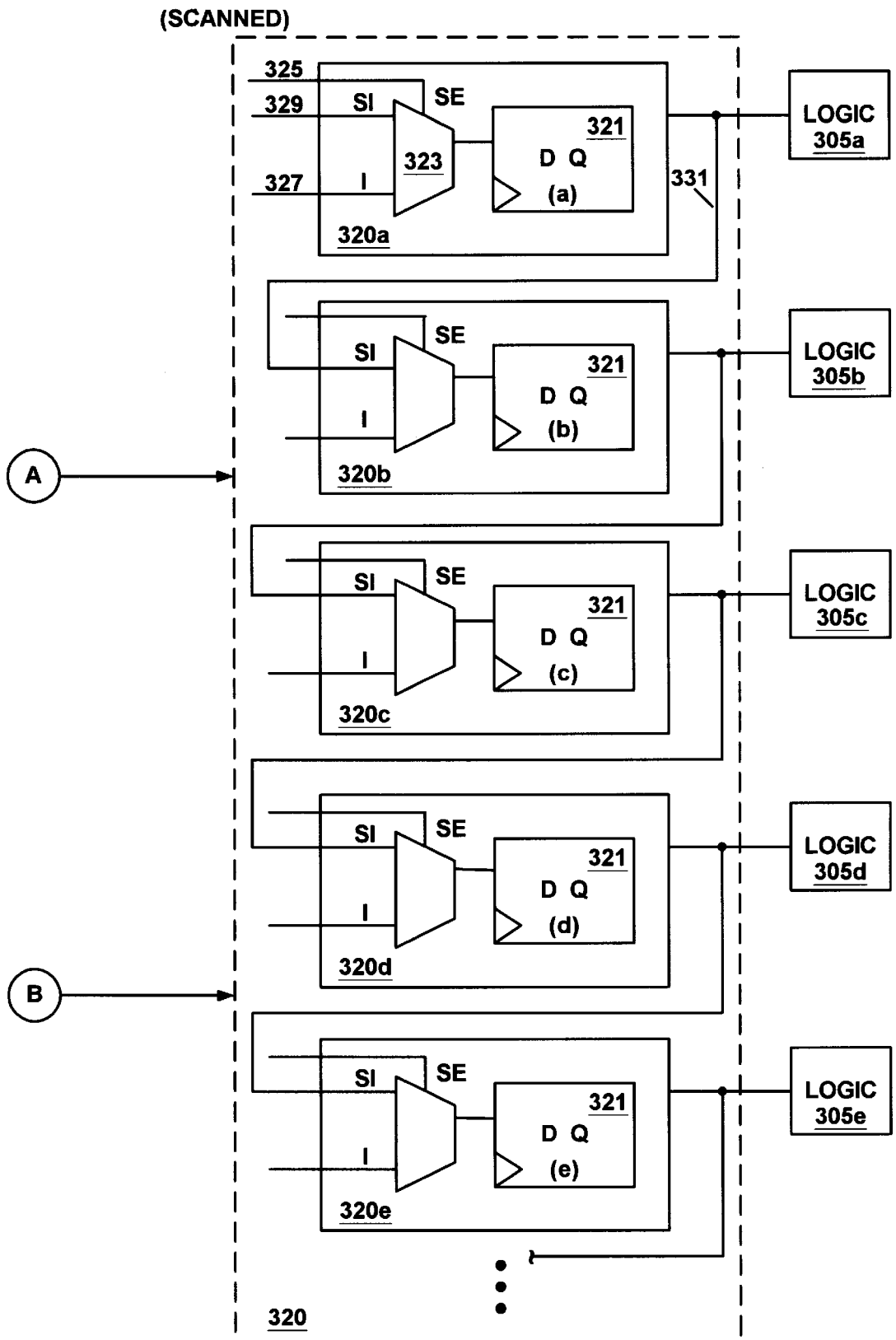

FIG. 3B illustrates a portion of the structure of the mapped memory cells of an integrated circuit as typically specified or inferred in an HDL circuit description (e.g., scannable netlist. FIG. 3B depicts a memory cells 301, combinational logic 304, and a memory unit 320. Memory cells 301, combinational logic 304, and memory unit 320 interact to implement the functionality of the integrated circuit described by the HDL circuit description. Memory cells 301 consists of a plurality of individual non-scan memory cells 307a–307e. In this example, five exemplary D flip-flops are illustrated 307a–307e. Each non-scan memory cell 307a–307e receives an input 306a–306e from either a primary input off chip, from the combinational logic block 305, or from another memory cell within block 301. These non-scan memory cells also have outputs 309a–309e that typically drive combinational logic gates or other memory cells or can be a primary output that goes off chip.

FIG. 3B also shows memory unit 320, which includes a plurality of scannable memory cells. As is well known in the art, a typical DFT process implements DFT functionality by linking separate memory cells together to form a scan chain. In so doing, the memory cells become "scannable" (e.g., scannable memory cells 320a–e). A scannable memory cell is also referred to as a test memory cell. With respect to HDL circuit descriptions, such memory cells are also called sequential cells. FIG. 3B depicts the relationship of memory cells 321a–e disposed within memory unit 320 in a scan chain configuration. As is well known, this memory unit 320 accommodates testability for faults and allows loading of test vectors into the cells and scanning of certain data out of the cells in response to the application of the test vectors.

As is referred to herein, a non-scanned or unscanned memory cell indicates a memory cell that does not support scanning (e.g., cell elements 307a–e of FIG. 3B). A scan cell or scannable cell indicates a memory cell that supports scanning (e.g., cells 320a–e of FIG. 3B). An unscannable or non-scannable memory cell indicates a memory cell that is non-scannable or otherwise user indicated as not to be scanned.

The scannable memory cells 320a–e in this example consist of multiplexed input D flip-flops and are linked together in chains, as shown, to form shift register configurations. Each particular scannable memory cell can be analogous to each other cell, so one cell 320a is described herein. Scannable cell 320a contains a memory cell 321a and a multiplexer 323. The D input of cell 321a is coupled to the output of a multiplexer 323 which has a select line input 325, called the scan enable, or SE, line. The data inputs to the mux 323 are (1) an I input 327 analogous to input 306a from memory cells 301 and (2) an SI shift input 329 which originates from a previous scannable memory cell or from a primary input provided that cell 320a is the first cell in a scan chain. It is appreciated that the output of the mission mode logic 305a is typically routed (e.g., by a designer) to the I inputs 327 of the scannable memory cells for observation or to a primary output. The output 331 of cell 321a is routed to mission mode circuitry 305a of the combinational logic 305 and is also routed to another scannable memory cell (e.g., 320b) or to a primary output if this cell is the last cell of a scan chain. It is appreciated that the Q or /Q output pin can be utilized in the chaining configuration.

In this configuration, scannable memory cells 320a–e comprise an exemplary scan chain because the output of one sequential cell is coupled to the input of an adjacent sequential cell.

The circuitry shown in unit 320 has two modes, mission and test. In mission mode, the SE lines are not asserted, and data is selected by the mux from the I inputs. In test mode, the SE inputs of each scannable memory cell 320a–e are asserted such that the shift inputs SI are active, and a test vector (string of bits) can be inserted into the integrated circuit through a primary input, shifted through the scannable memory cells 320a–e, and then applied to the appropriate logic 305a–e coupled thereto. The product information generated by the tested logic (305a–e in this example) is then stored in a scan chain and shifted out to a primary output for observation. In this manner, the testability of the combinational logic block 305 is greatly enhanced as logic essentially buried deep within a pipeline of the integrated circuit (e.g., coupled only to scannable memory cells) can be directly isolated and tested by shifting test vectors into a scannable memory cell chain and then shifting the product back out to a scannable memory cell chain for observation.

Not all scannable memory cells can be included within a scan chain for a variety of reasons (e.g., memory cells 307a–e of memory cells 301). Some memory cells do not offer a scan-in ability or do not offer a scan-out ability due to logic considerations. Further, some cells cannot capture data at their data in port. Also, some memory cells directly control the reset, clock, or input line of another memory cell in a scan chain. In this case, when the test vector is loaded into the scan chain, portions of the test vector can be altered, e.g., where the test vector data loaded into a first scan cell is used as a set or reset signal applied to a second scan cell, thereby overwriting the test data in the second scan cell of the scan chain. Lastly, some memory cells, after the scan chain is constructed, do not offer scannability for various logic reasons, e.g., the clock input is not clocked properly.

Figure 4:
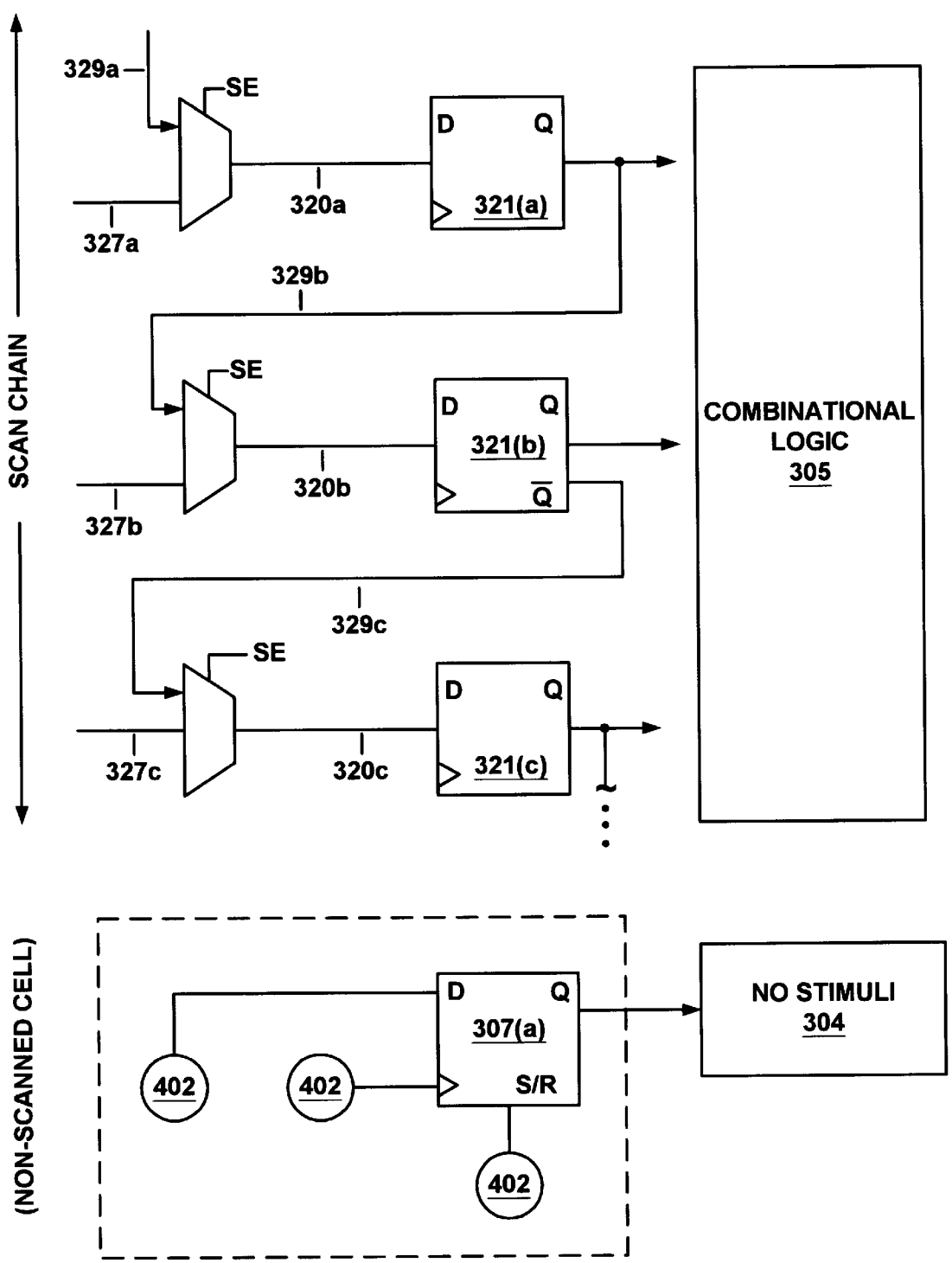
FIG. 4 shows an exemplary non-scan of memory cell and an exemplary scannable memory cell.

FIG. 4 illustrates an exemplary non-scannable memory cell 307a and scannable memory cells 321a–c. As described above, memory cells that cannot be placed into a scan chain, as is well known in the art, are referred to as non-scannable memory cells. A sample scan chain in accordance with one embodiment of the present invention is shown including scannable memory cells 321a–321c of memory unit 320a. Memory cells 321a–c are coupled to receive test data via scan lines 329a–c. This test data provides the ability to stimulate combinational logic 305 with test inputs to determine its functionality. In contrast, logic 402 is coupled to memory cell 307a and is not directly coupled to a primary input or output. Because of this, test data can easily be inserted into memory cell 307a. There is no direct access to memory cell 307a. As such, there is no way to provide proper test stimuli to logic 304. Hence, this memory cell 307a is non-scannable.

Although not shown, it should be appreciated that combinational logic 305 outputs to primary outputs (off chip) or to scannable memory cells. This allows the observation of output to combinational logic 305 to determine its proper operation. With respect to non-scannable memory cell 307, in the prior art, no meaningful observations were possible for circuitry coupled to non-scannable memory cells. However, the present invention improves controllability and observability with respect to such non-scan of memory cells.

As described above, the present invention provides a system which enables an order of magnitude improvement in run-time performance for ATPG and similar analysis-related programs and provides for increased testing coverage of a resulting design, thereby providing more efficient testing completed devices, particularly non-scannable memory cells and the logic coupled to their outputs. The present invention functions by transforming a sequential model of a circuit into a combinational circuit. The use of combinational circuits provides an order of magnitude increase in run-time performance of an ATPG tool and related ATPG analysis. The present invention provides observability non-scannable memory cells into logic coupled to their outputs by transforming the non-scannable memory cells into appropriate corresponding combinational logic elements. The process of the present invention is diagrammed in FIG. 5 below.

Figure 5:
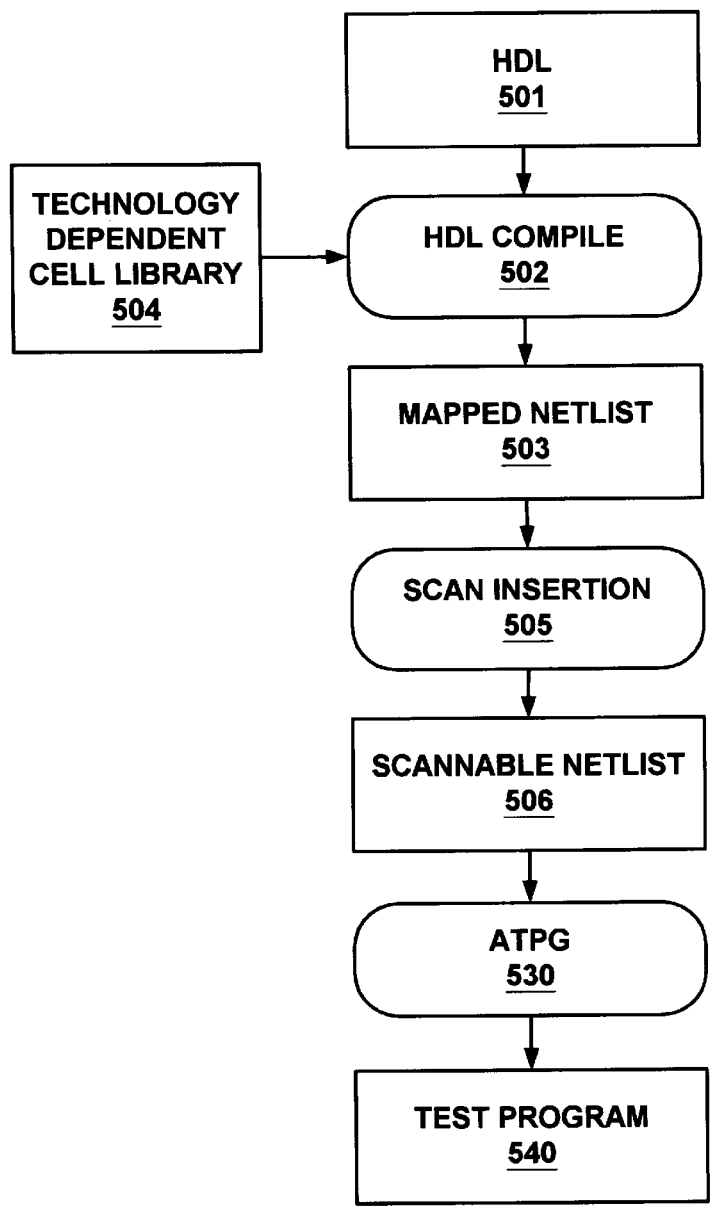
FIG. 5 shows a diagram of a process in accordance with one embodiment of the present invention.

With reference now to FIG. 5, a diagram 500 of a process in accordance with one embodiment of the present invention is shown. The process of diagram 500 is executed within a CAD system (e.g., computer system 112). In accordance with the present invention, HDL descriptions of an integrated circuit enter at block 501. Accompanying the HDL 201 is a set of performance constraints applicable to the design which typically include timing, area, power consumption, and other performance related limitations that the compiler (e.g., in step 502) will attempt to satisfy when synthesizing the integrated circuit design. These constraints can also include non-performance related constraints such as structural and routing constraints. The HDL descriptions go through a basic compile process in block 502, where the integrated circuit descriptions of the integrated circuit are compiled. The compiler (also called an HDL compiler, RTL synthesizer, or architectural optimizer) inputs the HDL description 501 and generates therefrom a technology independent or "generic" netlist. The generic netlist is then compiled using logic optimization procedures and a mapping procedures which interface with a technology dependent cell library 504 (e.g., from LSI, VLSI, TI or Xilinx technologies, etc.). The cell library 504 contains specific information regarding the cells of the specific technology selected such as the cell logic, number of gates, area consumption, power consumption, pin descriptions, etc., for each cell in the library 504. The compiling procedure of block 202 ultimately generates a gate level mapped netlist 503 that is technology dependent and that has cells specifically selected in accordance with the particular manufacturing technology being used to fabricate the device.

At block 505 of FIG. 1A, DFT process performs a particular test insertion process (here a scan) to implement testability cells or "test mode" cells into the overall integrated circuit design. In the scan insertion process 505, memory cells of the mapped netlist 503 are replaced with memory cells that are specially designed to apply and observe test vectors or patterns to and from portions of the integrated circuit. Process 505 also performs linking groups of scannable memory cells into scan chains so that the test vectors can be cycled into and out of the integrated circuit design. The output of the scan insertion process 505 is a scannable, or scanned, netlist 506. The scannable netlist is subsequently processed by an automatic test pattern generator tool of the present invention in block 530. The output of the automatic test pattern generator tool is test program 540 for use with automated test equipment in testing finished integrated circuit devices.

It should be appreciated that the functionality of the present invention is largely implemented through the operation of the automatic test pattern generator tool in block 530. The ATPG tool of the present invention transforms the sequential circuit described by scannable netlist 506 into an equivalent combinational circuit. This combinational circuit is then analyzed in order to determine the test program 540. The use of the combinational circuit provides an order of magnitude run-time improvement in the performance of the ATPG tool. The operation of the automatic test pattern generator tool is shown in greater detail in FIG. 6 below.

Figure 6:
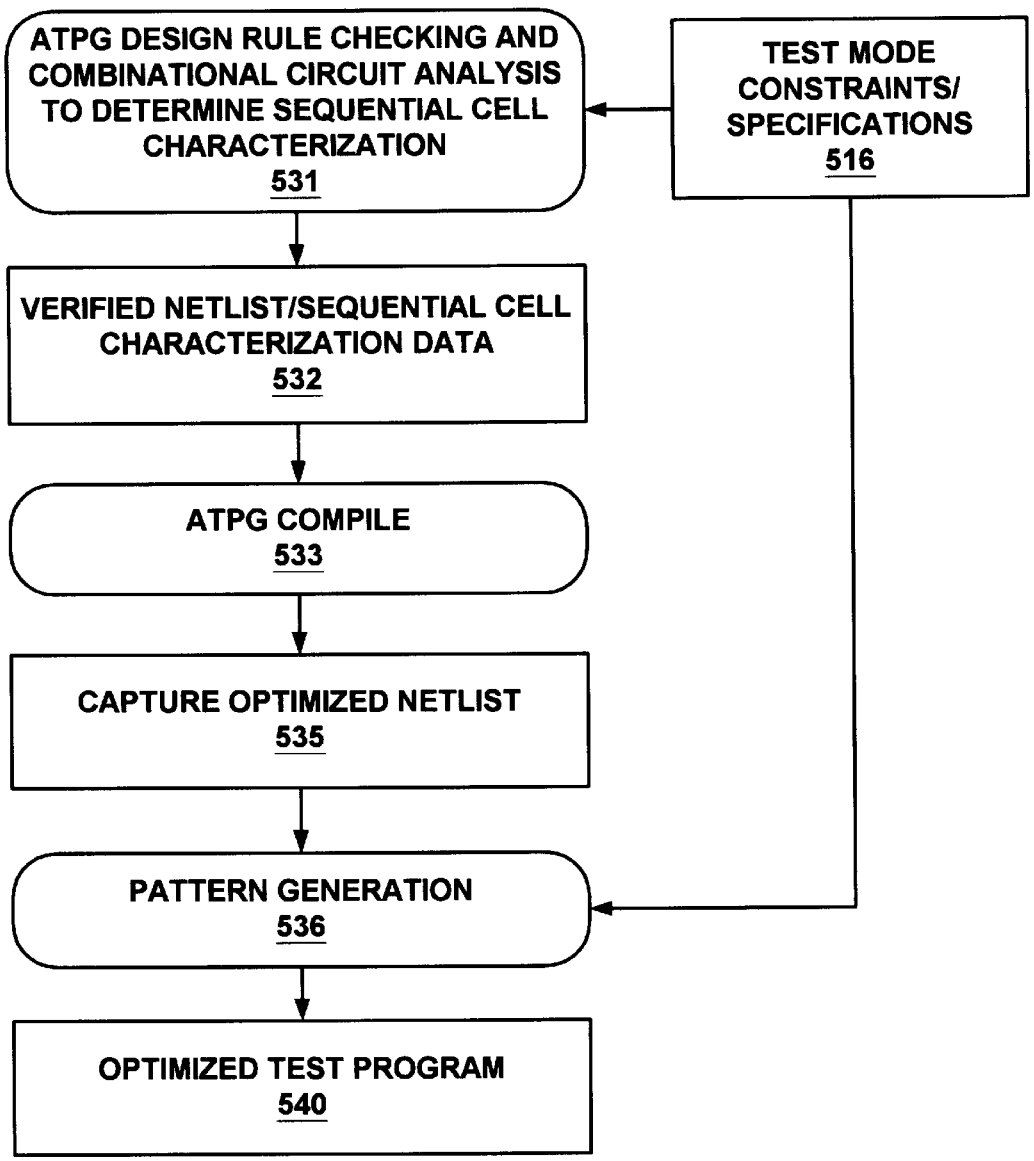
FIG. 6 shows the steps comprising the automatic test pattern generation operations step from the diagram of FIG. 5 in accordance with one embodiment of present invention.

Referring now to FIG. 6, the blocks of a process 600 comprising the automatic test pattern generator operation of block 530 from FIG. 5 are shown. In block 531 of FIG. 6, an automatic test pattern generator design rule checking program receives the scannable netlist 506 as its input. The automatic test pattern generator design rule checker 531 functions by verifying scannable netlist 506 meets a set of test mode constraints and test specifications 516. The test mode constraints/specifications 516 are comprised of the various rules and protocols with which the automatic test pattern generator unit is designed to function. In the prior art, this design rule checker was very stringent. The constraints were inflexible and tended to force numerous recompiles as the scan insertion process was modified or the test constraints were modified. In accordance with the prior art, scannable netlist 509 had to be strictly compliant with test mode constraints 516. The compliance ensured the prior art automatic test pattern generator programs could understand and properly operate upon the scannable netlist.

In accordance with the present invention, however, automatic test program generator design rule checker 531 can function with scannable netlists which may not comply with traditional design-for-test rules (e.g., test mode constraints 516). This permits a broader variety of scannable netlists, and hence, circuits, to be analyzed and processed. The output of design rule checker 531 is an automatic test pattern generator verified netlist 532. The output also includes sequential cell characterization data used in the ATPG compile process.

In block 533, the verified netlist 532 is processed for automatic test pattern generator compile. In block 533, the ATPG compiler transforms the circuit specified by the verified netlist 532 into an equivalent combinational circuit. The ATPG compiler 533 also processes a set of test capture cycle specifications 534 as it transforms the verified netlist 532. The test capture cycle specifications typically comprise the various capture events in a test cycle for the circuit described by the verified netlist 532.

In accordance with the present invention, multiple skewed capture events can be processed within a single capture cycle. The circuit described by verified netlist 532 can have several capture events within a single capture cycle. This means that the functionality of the circuit can be verified by capturing data within the various memory cells of the scan chain at multiple instances in time. This provides increased controllability and observability of the components of the integrated circuit within a single capture cycle. This increased controllability and observability, in turn, provides for more efficient testing of the integrated circuit.

It should be appreciated that in the prior art, multiple capture events were never allowed within a single capture cycle. Prior art design rule checking for automatic test pattern generation rejected netlists which contained multiple capture events. Such netlists could not be properly processed by prior art ATPG compilers. The present invention, however, not only correctly processes multiple capture events, but uses multiple capture events to greatly improve the efficiency of the ultimately generated test program 540. Aspects of the present invention dealing with multiple capture events and processing thereof are further described below.

Referring still to FIG. 6, the ATPG compiler 533 not only performs a transformation from sequential based circuits to combinational circuits, the compiler 533 builds a specific "view" of the integrated circuit as described by the verified netlist 532. This view is optimized for simulation with multiple temporal capture events. The view is further optimized for simulation for the purposes of determining optimum test patterns which provide the highest degree of visibility to the integrated circuit. In the present embodiment, the simulation itself is performed in a pattern generator as represented by block 536. The output of the compiler 533 is essentially a "capture optimized" netlist 535.

The pattern generator 536 runs a simulation of the integrated circuit as described by the capture optimized netlist 535 and determines an optimized test program therefrom. Test pattern generator 536 generates various stimuli to the design and examines the outputs of the design in order best to determine the optimum test pattern. It should be noted that the test pattern generator 536 is able to operate much faster than prior art test pattern generators. This is due in part to the fact that the netlist used by the test pattern generator 536 is specifically optimized by the ATPG compiler. The ATPG compiler 533 explicitly performs the optimizations (dealing the capture optimized netlist 535) which allow the test pattern generator to operate more efficiently. The output of the test pattern generator 536 is an optimized test program 540. The operation of the ATPG compiler 533 in the processing of all coupled capture events are described in greater detail below.

Figure 7:
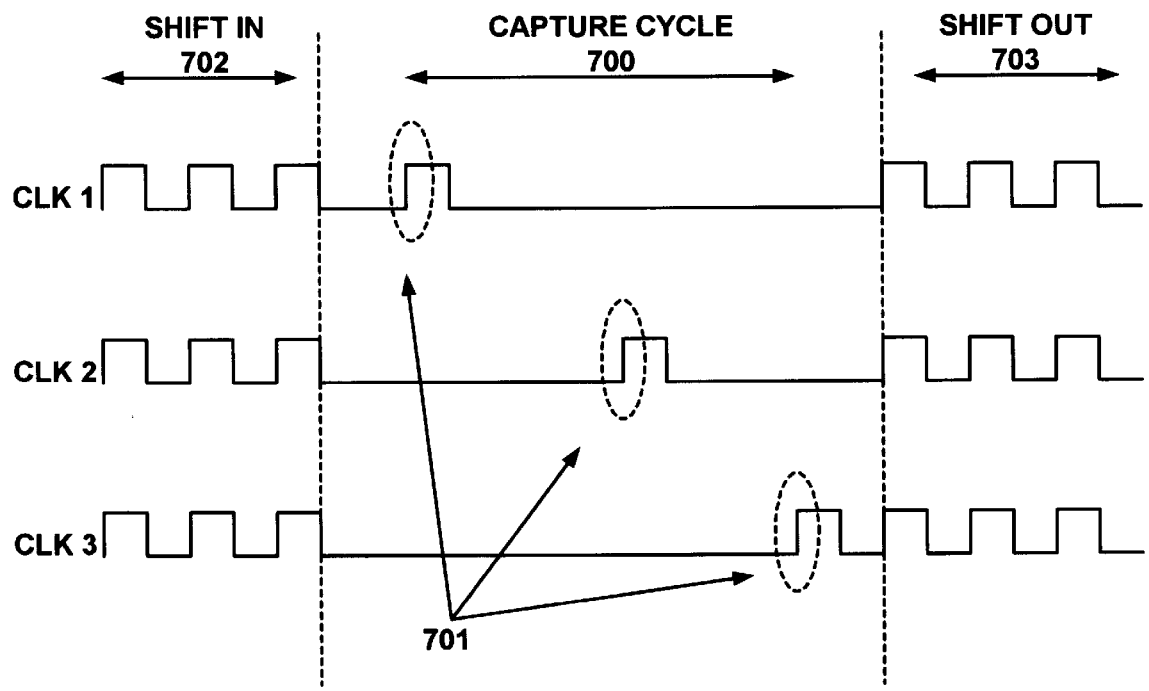
FIG. 7 shows a timing diagram depiction of a capture cycle in accordance with one embodiment of present invention.

Referring now to FIG. 7, a capture cycle 700 in accordance with one embodiment of a present invention is shown. Capture cycle 700 includes three capture events, or three times at which the scannable memory cells of the integrated circuit will be latched to store data. As depicted in FIG. 7, time increases across FIG. 7 from left to right. Three clock cycle capture events are shown, clock 1, clock 2, and clock 3, as indicated by the areas 701. The capture event clock 1 (e.g., the rising edge of the clock pulse) occurs earliest in time. The capture event of clock 2 occurs next in time. The capture event of clock 3 occurs latest in time. Each of these capture events occur within capture cycle 700. Preceeding capture cycle 700 is a scan shift in cycle 702. Following capture cycle 700 is a scan shift out cycle 703. In this example, the capture event of clock 2 is designated the "primary capture event".

In accordance with the present invention, transformation of the sequential circuit including the multiple skewed capture events is achieved by selecting a specific temporal reference among the multiple capture events in the test capture cycle. Thus, in capture cycle 700, one of the three capture events is designated the primary capture event (e.g., in this case clock 2). Based on the controllability and observability of the scannable memory cells relative to this point, the scannable memory cells are transformed into appropriate corresponding combinational logic elements. However, as is well known, the existence of multiple capture events within the capture cycle will obscure or otherwise occlude the controllability and observability of some of the scannable memory cells within the integrated circuit. The present invention explicitly accounts for this factor by replacing those scannable memory cells which lack observability or controllability relative to the selected reference point (e.g., the primary capture event) with a "tie-to-x" construct on the virtual input or virtual output of those scannable memory cells.

With respect to certain non-scannable memory cells which exhibit a relatively steady state, constant output, the present invention transforms them into corresponding constant logic sources as determined by their steady state output. The non-scannable memory cells are transformed to constant logic sources according to their specific output values observed relative to the specific temporal reference point (e.g., the designated primary capture event). This transformation improves controllability related to the outputs of the non-scannable memory cells and, therefore, results in better test program coverage results in the areas of the circuit around such elements (e.g., combinational logic 304 of FIG. 3B). Thus, not only are the scannable memory cells which lack observability or controllability relative to the reference point replaced (e.g., with tie-to-x constructs) in order to improve efficiency, certain non-scannable memory cells exhibiting steady state constant output are also replaced (e.g., according to their steady state output).

With reference still to FIG. 7, it should be appreciated that the design rule checker 531 performs checks in order to determine whether the values of the scannable memory cells are destroyed between the end of the scan shift in the primary capture event. The behavior of the scannable memory cells is also examined from the point immediately after the primary capture event to the end of the capture cycle (e.g., scan shift out). The results of these checks are used to classify the scannable memory cells according to their controllability and observability. This process is referred to as "characterization."

In accordance with present invention, the characterization process is performed in two parts. During the first part, scannable memory cells are first characterized based on the frames they capture data. This check includes cases where shifts in values are destroyed before the PCE (e.g., referred to as load disturbance). This check also includes cases where the scannable memory cells are capturing data after the PCE (e.g., referred to as capture disturbance).

During the second part, the scannable memory cells are then characterized based on their capability to retain values between the primary capture event and the end of capture cycle. In accordance with the present invention, characterization process of the scannable memory cells will be complete only when these two parts are finished.

The following is a summary of the rules used by design rule checker 531 in characterizing the scannable memory cells:

1. Scannable memory cells capturing data only in the PCE are characterized as "controllable and observable".

2. Scannable memory cells capturing data before the PCE are characterized as "not controllable and observable".

3. Scannable memory cells capturing data after the PCE are characterized as "controllable and not observable".

4. Scannable memory cells capturing data in multiple frames are characterized as "not controllable and not observable".

5. Scannable memory cells not capturing at all are characterized as "controllable and not observable".

Figure 8:
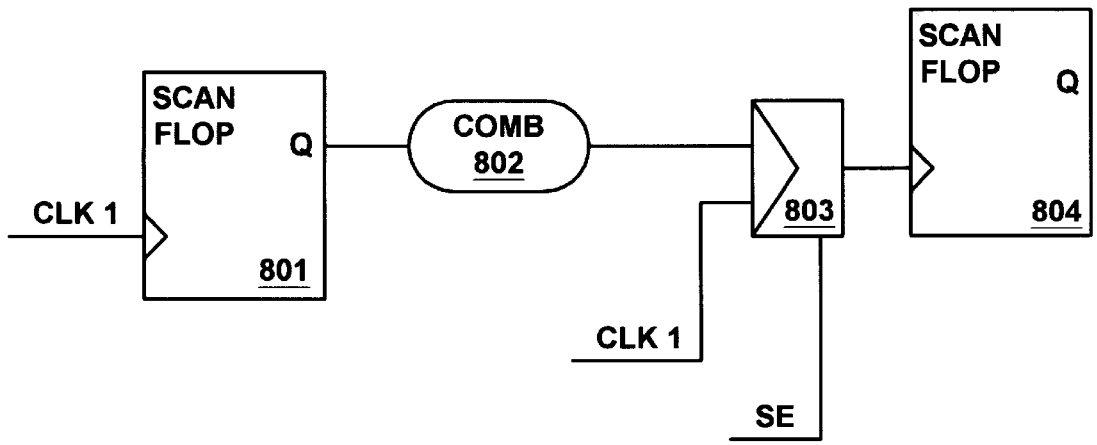
FIG. 8 shows an example circuit which includes scannable memory cells classified as "not controllable" and "not observable" in accordance with one embodiment of the present invention.
Figure 8:
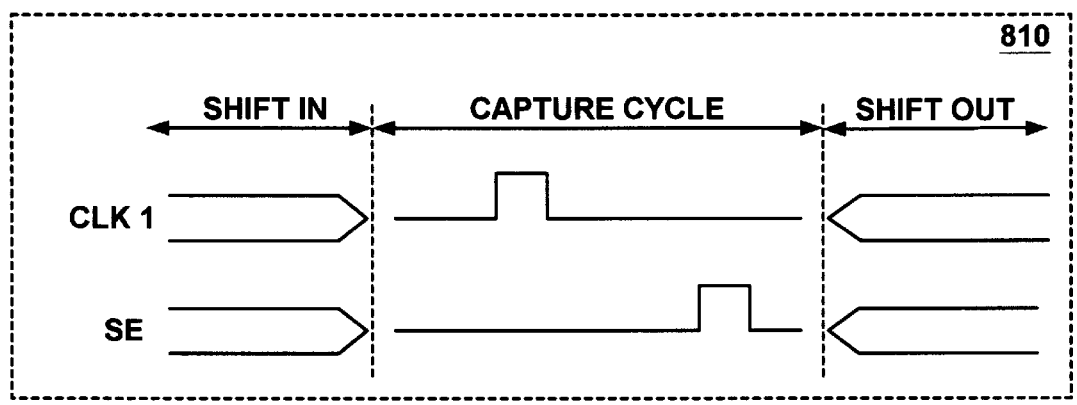

With reference now to FIG. 8, an example of a circuit 800 including a scannable memory cell classified as "not controllable" and "not observable" is shown. As depicted in FIG. 8, circuit 800 includes scan flop 801, combinational logic 802, non-scannable memory cell 803, and scan flop 804. As used herein, scan flops 801 and 804 are scannable memory cells. Scannable flop 801 is coupled to receive a clock input CLK. Combinational logic 802 and non-scannable memory cell 803 are coupled to receive primary inputs. Non-scannable memory cell 803 is also coupled to receive an internal signal SE.

In this example, scan flop 804 is classified as not controllable and not observable due to the fact that the value of scan flop 804 can be destroyed by the internal signal SE. It should be noted that SE can come from a number of sources. One particularly problematic source is spurious capture clock events. During the characterization process of the present invention, design rule checker 531 of the present invention simulates circuit 800 in order to determine whether any of the scannable memory cells receive spurious capture clock events. Those scan flops whose values are destroyed in the time interval between the end of the scan shift in and the beginning of the capture cycle are modeled as not controllable and not observable. As depicted in circuit 800, scan flop 804 can receive a spurious capture clock signal SE when the internal signal SE changes from logical one to logical zero. Since this capture event (e.g., the internal signal SE) happens before the designated primary capture event, scan flop 804 will be modeled as "not controllable and observable".

Similarly, scannable memory cells whose values are destroyed in the time period between the end of the capture cycle and beginning of the scan shift out are characterized as not observable. For example, in a case where scan flop 804 receives a spurious capture clock from internal signal SE when SE changes from 0 to 1 after the primary capture event, scan flop 804 will be modeled as "controllable and not observable". If both cases described in the above two paragraphs occur, then scan flop 804 will be characterized as "not controllable and not observable".

Figure 9:
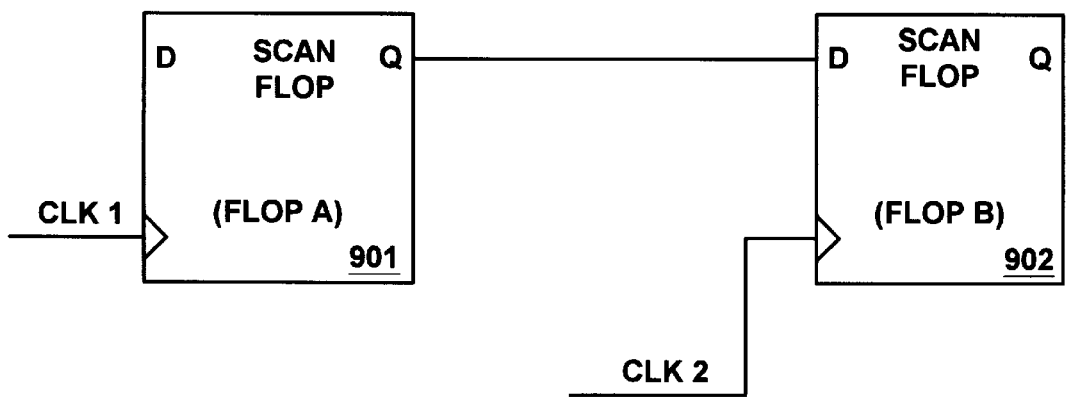
FIG. 9 shows an example circuit including scannable memory cells which are classified as "not observable" in accordance with one embodiment of the present invention.
Figure 9:
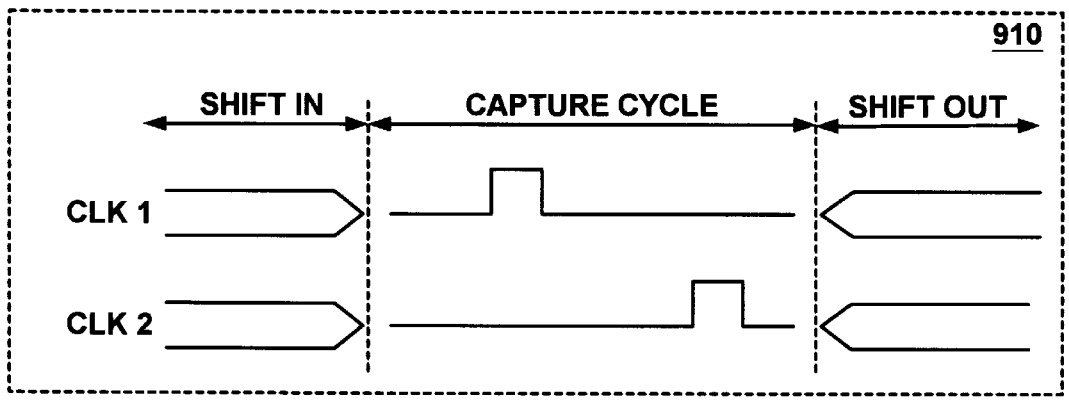

FIG. 9 shows an example of a circuit 900 including a scannable memory cell which is classified as "not observable." As depicted in FIG. 9, circuit 900 includes a scan flop 901 and a scan flop 902. Scan flop 901 is coupled to receive a capture clock input clk1, and scan flop 902 is coupled to receive a capture clock input clk2. The output of scan flop 901 is coupled to the input of scan flop 902. A timing diagram of the signals clk1 and clk2 is shown in region 910.

Circuit 900 shows the case where scannable memory cells (e.g., scan flop 901 and scan flop 902) capture both before and after the primary capture event. For example, clk1 is the primary capture event. In this case scan flop 901 captures on the primary capture event and scan flop 902 will be characterized as "controllable and not observable", since clk2 is after the primary capture event. Similarly, in a case where clk2 is the primary capture event, scan flop 901 will be classified as "not controllable and observable" since it captures data before the primary capture event and scan flop 902 will be classified as "controllable and observable". These characterizations are summarized in table 1 below.

TABLE 1

| primary capture event | FLOPA | FLOPB |
|---|---|---|
| clk1 | controllable and observable | controllable and not observable |
| clk2 | not controllable and observable | controllable and observable |
| clk1 = clk2 | controllable and observable | controllable and observable |

Figure 10:
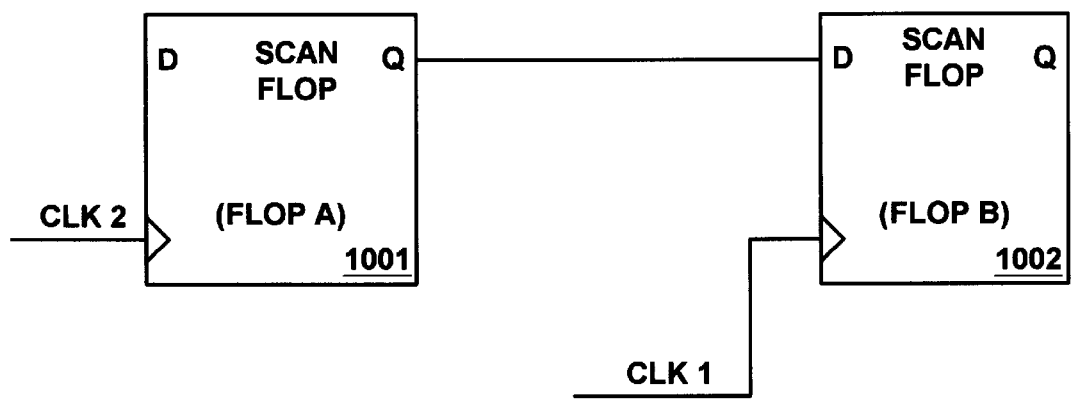
FIG. 10 shows an example circuit having substantially the same elements as the circuit shown in FIG. 9, but having clock inputs reversed.
Figure 10:
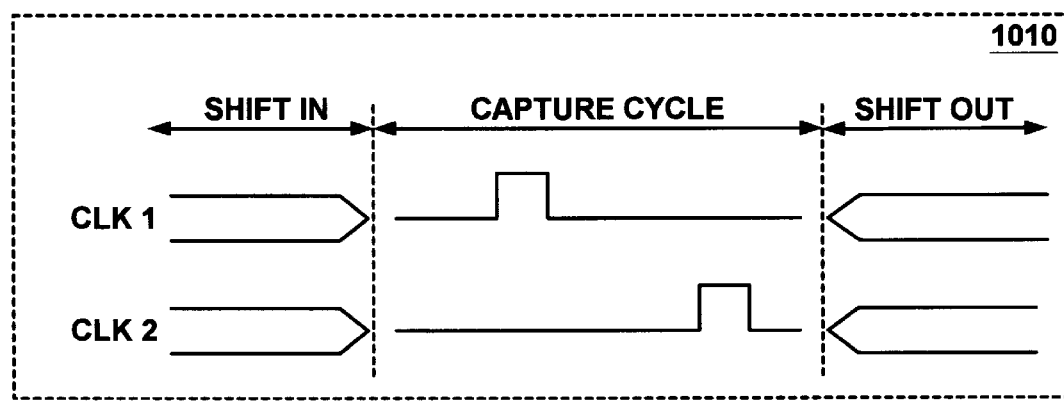

FIG. 10 shows a circuit 1000 which is substantially the same circuit 900 except that the inputs clk1 and clk2 are reversed. Region 1010 shows a timing diagram of the signals clk1 and clk2. Scan flop 1001 and scan flop 1002 are both scannable memory cells. The characterizations of scan flop 1001 and scan flop 1002 with respect to the input signals clk1 and clk2 are shown in table 2 below.

TABLE 2

| primary capture event | FLOPA | FLOPB |
|---|---|---|
| clk1 | controllable and not observable | controllable and observable |
| clk2 | controllable and observable | not controllable and observable |
| clkl = clk2 | controllable and observable | controllable and observable |

It should be appreciated that, in accordance with the present invention, scannable memory cells should retain captured values until the end of the capture cycle. Therefore, the design rule checker 531 has to make sure that the captured value is not destroyed by asynchronous clear/preset signals or spurious capture clocks. As described above, the design rule checker 531 handles cases where scannable memory cell values are destroyed due to capture or spurious capture clocks. In addition to these checks, design rule checker 531 performs checks to identify scannable memory whose captured values are destroyed because of asynchronous signals going active after their capture events. These cells will be characterized as "not observable." Examples are shown in FIG. 11 and FIG. 12 below.

Figure 11:
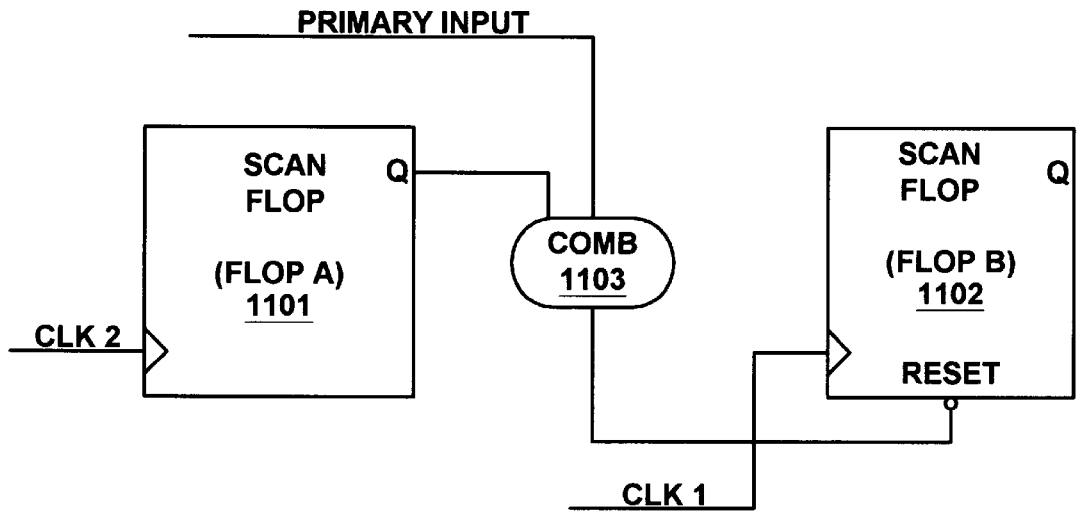
FIG. 11 shows an example circuit having scannable memory cells whose capture values are destroyed by asynchronous signals.
Figure 11:
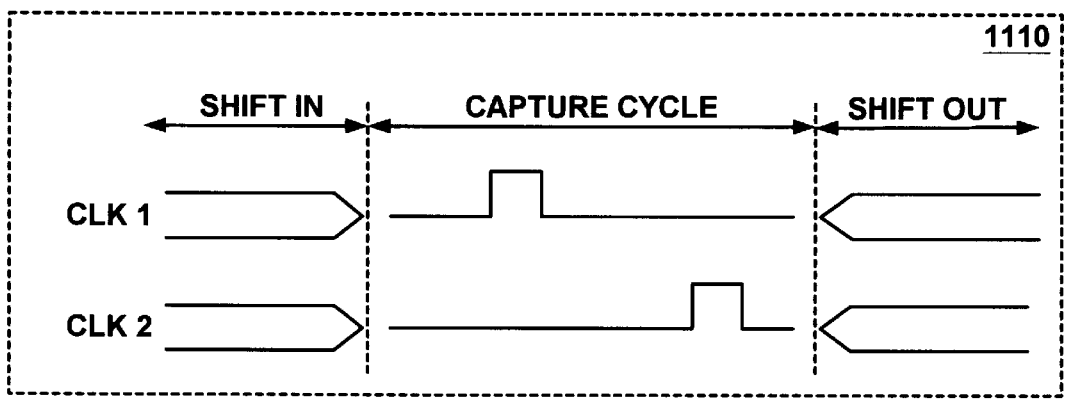
Figure 12:
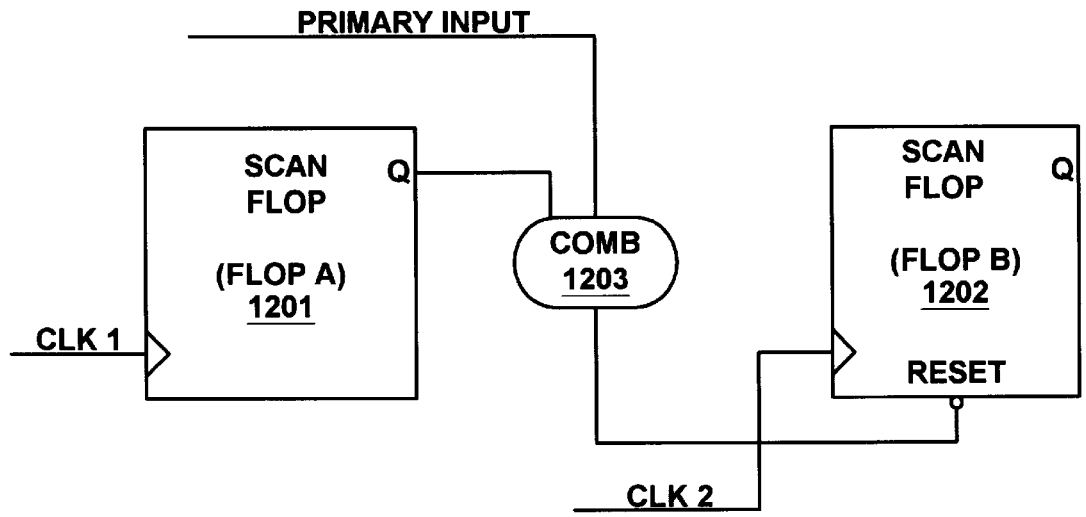
FIG. 12 shows an example circuit having substantially the same elements as the circuit shown in FIG. 11, but having the clock inputs reversed.
Figure 12:
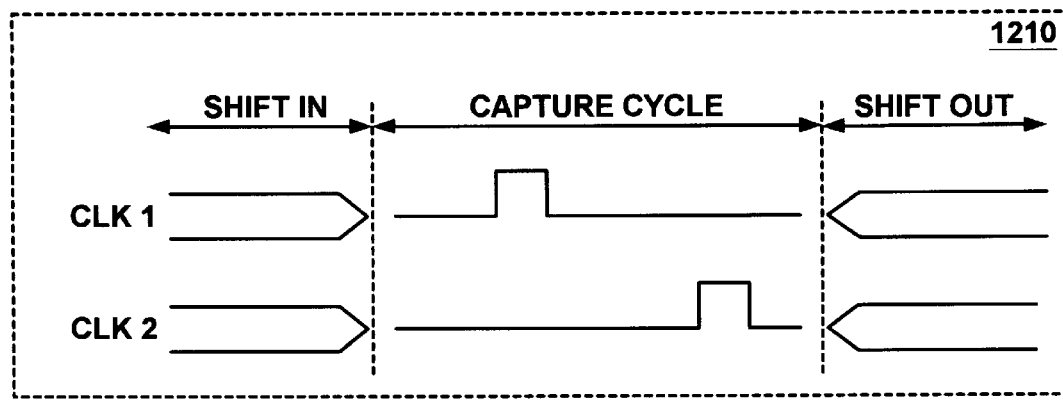

FIG. 11 shows a circuit 1100 showing scannable memory cells whose captured values are destroyed by asynchronous signal (e.g., a primary input). Circuit 1100 shows a scan flop 1101, combinational logic 1103, and a scan flop 1102. Scan flop 1101 and scan flop 1102 receive capture clock signals clk2 and clk1 respectively. Scan flop 1101 is coupled to scan flop 1102 via combinational logic 1103. Scan flop 1102 is also coupled to a primary input (e.g., an asynchronous signal) via combinational logic 1103.

Circuit 1100 shows the case where a scan flop's values can be destroyed by an asynchronous signal received after the primary capture event. The primary input signal can be received asynchronously at any time. For example, the signal clk1 is the primary capture event. Since the signal clk2 occurs after the primary capture event (e.g., clk1), scan flop 1101 will be characterized as "not observable." Since the value captured by scan flop 1102 can be destroyed by the value captured by scan flop 1101 (since scan flop 1102 captures with clk1), scan flop 1102 will also be characterized as "not observable." A timing diagram of signals clk1 and clk2 is shown in region 1110. The characterizations of scan flop 1101 and scan flop 1102 are shown in table 3 below.

TABLE 3

| primary capture event | FLOPA | FLOPB |
|---|---|---|
| clk1 | controllable and not observable | controllable and not observable |
| clk2 | controllable and observable | not controllable and not observable |
| clk1 = clk2 | controllable and observable | controllable and not observable |

FIG. 12 shows a circuit 1200 which is substantially the same circuit 1100 except that the inputs clk1 and clk2 are reversed. Region 1210 shows a timing diagram of the signals clk1 and clk2. Scan flop 1201 and scan flop 1202 are both scannable memory cells. The characterizations of scan flop 1201 and scan flop 1202 with respect to the input signals clk1 and clk2 are shown in table 4 below.

TABLE 4

| primary capture event | FLOPA | FLOPB |
|---|---|---|
| clk1 | controllable and observable | controllable and not observable |
| clk2 | not controllable and observable | controllable and observable |
| clk1 = clk2 | controllable and observable | controllable and not observable |

In this manner, the present invention accounts for the multiple skewed capture events included in a scannable netlist. As described above, transformation of the sequential circuit including the multiple skewed capture events is achieved by selecting a specific temporal reference among the multiple capture events in the test capture cycle, and classifying the scannable memory cells based upon their controllability and observability relative to this point. This allows the successful transformation of a much larger number of circuit netlists than possible with the prior art.

This allows an integrated circuit designer a much larger degree of flexibility in designating capture events for testing the integrated circuit design. Alternatively, the present invention has capability of automatically selecting a primary capture event and any other needed capture events in order to provide the best test coverage with the generated test program.

Thus, the present invention provides a system which enables an order of magnitude improvement in run-time performance for ATPG and similar analysis related programs. The system of the present invention allows ATPG analysis and processing of scannable netlists which may not adhere to conventional DFT design rules and which thereby allows the analysis and processing of a broader variety of circuit types. The system of the present invention provides a time efficient design synthesis system operable within a computer implemented CAD system that includes effective DFT processes. The present invention further provides a system which effectively broadens the constraints with which the scannable netlist is subjected, thereby reducing the complexity and the amount of time required in recompiling the HDL design. Additionally, the present invention provides for increased testing coverage of a resulting design, thereby providing more efficient testing completed devices.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practical application, thereby to enable others skilled in the art best to utilize the invention and various embodiments with various modifications as are suited to the particular use contemplated. It is intended that the scope of the invention be defined by the Claims appended hereto and their equivalents.

What is claimed is:

1. In a computer implemented synthesis system, a method of generating a test program for use in testing a device with ATE (automated test equipment) comprising the computer implemented steps of:

a) processing a sequential circuit netlist, the sequential circuit netlist representing a design to be realized in physical form;

b) transforming the sequential circuit netlist into a combinational logic netlist;

c) performing combinational circuit analysis on the combinational logic netlist;

d) performing ATPG (automatic test pattern generation) analysis on the combinational logic netlist to generate a test program including a plurality of test vectors for application to the design by executing a pattern generator; and e) storing the test program into the computer memory unit, the test program adapted for use with automated test equipment for testing a device resulting from the design.

2. The method of claim 1, wherein the processing of the sequential circuit netlist to implement the step of transforming the sequential circuit netlist to the combinational logic netlist further includes the steps of:

identifying non-scannable cells included in the sequential circuit netlist; and replacing at least one of the non-scannable cells with a constant logic source to increase the observability of combinational logic coupled to the at least one non-scannable cell.

3. The method of claim 2, wherein the at least one non scannable cell is replace with a constant logic source according to an observed output value of the non scannable cell relative to one of multiple skewed capture events of the sequential circuit netlist.

4. The method of claim 1, further including the steps of:
identifying scannable cells included in the sequential circuit netlist;
performing ATPG design rule checking on the sequential circuit netlist to characterize the scannable cells according to their observability with respect to one of multiple skewed capture events of the sequential circuit netlist; and
performing ATPG design rule checking on the sequential circuit netlist to characterize the scannable cells according to their controllability with respect to one of the multiple skewed capture events.

5. The method of claim 4, further including the steps of:
selecting a specific temporal reference point from among the multiple skewed capture events;
designating the specific temporal reference point as a primary capture event frame;
characterizing the scannable cells according to their observability and controllability with respect to the primary capture event frame; and
using the characterizations of the scannable cells to transform the sequential circuit netlist into the combinational logic netlist.

6. The method of claim 4, wherein the characterization of the scannable cells is used to replace the scannable cells with equivalent tie-to-X constructs on the virtual inputs and virtual outputs of the scannable cells, and wherein the tie-to-X constructs enable the transformation of the sequential circuit netlist to the combinational logic netlist.

7. The method of claim 1 wherein a user designates one of multiple skewed capture events of the sequential circuit netlist as a primary capture event and wherein the combinational circuit analysis is performed with respect to the primary capture event.

8. The method of claim 1 wherein non-scannable cells included in the sequential circuit netlist are D flip-flops and wherein scannable cells included in the sequential circuit netlist are multiplexed input D flip-flops.

9. The method of claim 1 wherein non-scannable sequential cells and scannable sequential cells included in the sequential circuit netlist are level sensitive latches.

10. A CAD (computer aided design) design synthesis system for generating a test program for use in testing a device with ATE (automated test equipment) by processing a scan based sequential circuit netlist having multiple, skewed capture events, comprising:
a computer system including a processor coupled to a volatile memory and a non-volatile memory, the volatile and non-volatile memories for containing computer readable software which when executed by the computer system cause the computer system to implement a method for for generating a test program for use in testing a device with ATE, the method comprising the computer implementing the steps of:
receiving an HDL specification representing a design to be realized in physical form and storing the HDL specification in a computer memory unit;
receiving constraints applicable to the design;
compiling the HDL specification with a compiler to produce a netlist description of the design wherein the netlist comprises functional logic blocks and connections there between including scannable cells, non-scannable cells, and combinational logic, and wherein the netlist is a scan-based sequential circuit netlist having multiple, skewed capture events; and
processing the sequential circuit netlist in the computer system to implement the steps of:
a) transforming the sequential circuit netlist to a combinational logic netlist
b) identifying scannable cells included in the sequential circuit netlist;
c) performing ATPG design rule checking on the sequential circuit netlist to characterize the scannable cells according to their observability with respect to one of the multiple skewed capture events; and
d) performing ATPG design rule checking on the sequential circuit netlist to characterize the scannable cells according to their controllability with respect to one the multiple skewed capture events;
e) performing combinational circuit analysis on the combinational logic netlist
f) performing ATPG (automatic test pattern generation) analysis on the combinational logic netlist to generate a test program including a plurality of test vectors for application to the design; and
g) storing the test program into the computer memory unit, the test program adapted for use with automated test equipment for testing a device resulting from the design.

11. The system of claim 10, wherein the processing of the sequential circuit netlist to implement the step of transforming the sequential circuit netlist to the combinational logic netlist further includes the steps of:
identifying non-scannable cells included in the sequential circuit netlist; and
replacing at least one of the non-scannable cells with a constant logic source to increase the observability of combinational logic coupled to the at least one non-scannable cell.

12. The system of claim 11, wherein the at least one non scannable cell is replace with a constant logic source according to an observed output value of the non scannable cell relative to one of the multiple skewed capture events.

13. The system of claim 10, further including the step of accepting test capture cycle specifications from a user that temporally define the multiple skewed capture events.

14. The system of claim 13, further including the steps of:
selecting a specific temporal reference point from among the multiple skewed capture events;
designating the specific temporal reference point as a primary capture event frame;
characterizing the scannable cells according to their observability and controllability with respect to the primary capture event frame; and
using the characterizations of the scannable cells to transform the sequential circuit netlist into the combinational logic netlist.

15. The system of claim 13, wherein the characterization of the scannable cells is used to replace the scannable cells with equivalent tie-to-X constructs on the virtual inputs and virtual outputs of the scannable cells, and wherein the tie-to-X constructs enable the transformation of the sequential circuit netlist to the combinational logic netlist.

16. The system of claim 10 wherein a user designates one of the multiple skewed capture events as a primary capture event and wherein the combinational circuit analysis is performed with respect to the primary capture event.

17. The system of claim 10 further including the step of executing a pattern generator to process the combinational logic netlist and generate the test program.

18. The system of claim 10 wherein the non-scannable cells are D flip-flops and wherein the scannable cells are multiplexed input D flip-flops.

19. The system of claim 10 wherein the non-scannable sequential cells and the scannable sequential cells are level sensitive latches.

20. In a computer implemented logic synthesis system, a method of simulating a design using design synthesis tools in order to determine an optimum test program for later application to an integrated circuit device resulting from the design, wherein the test program is adapted to be applied to the integrated circuit device with ATE (automated test equipment), the method comprising the computer implemented steps of:

receiving an HDL specification representing a design to be realized in physical form and storing the HDL specification in a computer memory unit of the computer implemented synthesis system;

compiling the HDL specification with a compiler to produce a scan-based sequential netlist description of the design, wherein the netlist comprises functional logic blocks and connections there between including scannable cells, non-scannable cells, and combinational logic, and wherein the sequential circuit netlist includes multiple, skewed capture events; and processing the sequential circuit netlist using an ATPG (automatic test pattern generation) program to implement the steps of:
    a) performing ATPG (automatic test pattern generator) design rule checking on the sequential circuit netlist;
    b) identifying scannable cells included in the sequential circuit netlist;
    c) characterizing the scannable cells according to their observability with respect to one of the multiple skewed capture events;
    d) characterize the scannable cells according to their controllability with respect to one the multiple skewed capture events;
    e) compiling the sequential circuit netlist into a capture optimized netlist by using an ATPG compiler;
    f) transforming the sequential circuit netlist to a combinational logic netlist using the characterizations of the scannable cells; and
    g) executing a pattern generation program to process the combinational logic netlist to generate a test program including a plurality of test vectors for application to the design.

21. The method of claim 20, wherein the processing of the sequential circuit netlist to implement the step of transforming the sequential circuit netlist to the combinational logic netlist further includes the steps of:
  identifying non-scannable cells included in the sequential circuit netlist; and
  replacing at least one of the non-scannable cells with a constant logic source to increase the observability of combinational logic coupled to the at least one non-scannable cell.

22. The method of claim 21, wherein the at least one non scannable cell is replace with a constant logic source according to an observed output value of the non scannable cell relative to one of the multiple skewed capture events.

23. The method of claim 20, further including the steps of:
  selecting a specific temporal reference point from among the multiple skewed capture events;
  designating the specific temporal reference point as a primary capture event frame;
  characterizing the scannable cells according to their observability and controllability with respect to the primary capture event frame; and
  using the characterizations of the scannable cells to transform the sequential circuit netlist into the combinational logic netlist.

24. The method of claim 20, wherein the characterization of the scannable cells is used to replace the scannable cells with equivalent tie-to-X constructs on the virtual inputs and virtual outputs of the scannable cells, and wherein the tie-to-X constructs enable the transformation of the sequential circuit netlist to the combinational logic netlist.

25. The method of claim 20 wherein a user designates one of the multiple skewed capture events as a primary capture event and wherein the combinational circuit analysis is performed with respect to the primary capture event.

26. The method of claim 20 wherein the non-scannable cells are D flip-flops and wherein the scannable cells are multiplexed input D flip-flops.

27. The method of claim 20 wherein the non-scannable sequential cells and the scannable sequential cells are level sensitive latches.

* * * * *